US012377731B2

(12) United States Patent
Pressman et al.

(10) Patent No.: US 12,377,731 B2
(45) Date of Patent: Aug. 5, 2025

(54) DEVIATION DETECTION SYSTEM FOR POWER CIRCUIT

(71) Applicant: Transportation IP Holdings, LLC, Norwalk, CT (US)

(72) Inventors: Jacob Pressman, Lawrence Park, PA (US); Ajith Kuttannair Kumar, Erie, PA (US); Jacob Kenneth Pedder, State College, PA (US)

(73) Assignee: Transportation IP Holdings, LLC, Norwalk, CT (US)

( * ) Notice: Subject to any disclaimer, the term of this patent is extended or adjusted under 35 U.S.C. 154(b) by 537 days.

(21) Appl. No.: 17/661,634

(22) Filed: May 2, 2022

(65) Prior Publication Data

US 2022/0266695 A1    Aug. 25, 2022

Related U.S. Application Data

(63) Continuation-in-part of application No. 16/374,447, filed on Apr. 3, 2019, now Pat. No. 11,327,121.
(Continued)

(51) Int. Cl.
*G01R 31/3842* (2019.01)
*B60L 3/00* (2019.01)
*B60L 53/60* (2019.01)

(52) U.S. Cl.
CPC ............ *B60L 3/0046* (2013.01); *B60L 53/60* (2019.02); *G01R 31/3842* (2019.01)

(58) Field of Classification Search
None
See application file for complete search history.

(56) References Cited

U.S. PATENT DOCUMENTS 5,602,462 A * 2/1997 Stich .................. H02J 9/062
                                              307/64
7,239,147 B2 * 7/2007 Kume ............... H01M 10/4285
                                              324/425
(Continued)

FOREIGN PATENT DOCUMENTS

DE    102006031730 A1 *  1/2008   ......... B60R 21/0132
JP    2010231968 A   * 10/2010
JP    2012212534 A     11/2012

OTHER PUBLICATIONS

Office Action for related Japanese Patent Application No. 2020-053007 dated Jul. 12, 2022 (4 pages).
(Continued)

*Primary Examiner* — Jason Lin
(74) *Attorney, Agent, or Firm* — K&L Gates LLP

(57) ABSTRACT

A system includes one or more sensors that generate sensor measurements representing a first parameter of one or more components of a power circuit. The system includes a control unit that obtains a reference rate of change value of the first parameter based at least in part on the sensor measurements over time. The control unit compares rates of change of monitored values of the sensor measurements over time to the reference rate of change value over time, and determines a deviation condition in response to the rate of change of a first monitored value of the sensor measurements differing from the reference rate of change value by more than a determined tolerance margin value. The control unit generates a control signal responsive to detecting the deviation condition to change an operating condition of at least one of the components of the power circuit.

20 Claims, 7 Drawing Sheets

Related U.S. Application Data

(60) Provisional application No. 63/363,594, filed on Apr. 26, 2022.

(56) References Cited

U.S. PATENT DOCUMENTS

| | | | |
|---|---|---|---|
| 8,219,333 B2* | 7/2012 | Li | G01R 31/36 702/63 |
| 8,994,339 B1* | 3/2015 | Kam | H01M 10/44 429/62 |
| 2001/0001533 A1* | 5/2001 | Stuck Andersen | H02J 7/0071 320/150 |
| 2005/0182536 A1* | 8/2005 | Doyle | G01R 31/3647 340/455 |
| 2006/0091858 A1* | 5/2006 | Johnson | H02J 7/0034 320/128 |
| 2007/0008666 A1* | 1/2007 | Morita | B60L 3/0069 361/42 |
| 2007/0152639 A1* | 7/2007 | Miller | H02J 7/007194 320/150 |
| 2008/0280192 A1* | 11/2008 | Drozdz | B60L 3/0046 700/297 |
| 2009/0130538 A1* | 5/2009 | Kaita | G01R 31/374 429/61 |
| 2010/0079108 A1* | 4/2010 | Monden | H01M 10/48 320/134 |
| 2011/0148361 A1* | 6/2011 | Yokotani | B60L 58/21 320/136 |
| 2011/0313613 A1* | 12/2011 | Kawahara | B60L 50/61 320/134 |
| 2015/0104680 A1* | 4/2015 | Wang | B60L 50/66 429/50 |
| 2016/0091374 A1* | 3/2016 | Kim | H01M 10/486 429/90 |
| 2016/0117906 A1* | 4/2016 | Eifert | G01R 31/382 340/584 |
| 2016/0362003 A1* | 12/2016 | Aiba | B60L 1/02 |
| 2017/0018817 A1* | 1/2017 | Simmonds | H01M 10/443 |
| 2017/0040646 A1* | 2/2017 | Beaston | G06F 11/0757 |
| 2018/0149701 A1* | 5/2018 | Koo | H02J 7/0029 |
| 2018/0312076 A1* | 11/2018 | Lee | H01M 10/625 |
| 2019/0033380 A1* | 1/2019 | Kim | H01M 10/0525 |
| 2019/0072616 A1* | 3/2019 | Matsushita | G01R 31/374 |
| 2020/0091562 A1* | 3/2020 | Mi | H01M 10/425 |
| 2020/0150640 A1* | 5/2020 | Chakraborty | G01R 31/2829 |

OTHER PUBLICATIONS

English translation of Office Action for related Japanese Patent Application No. 2020-053007 dated Jul. 12, 2022 (6 pages).

\* cited by examiner

DEVIATION DETECTION SYSTEM FOR POWER CIRCUIT

CROSS-REFERENCE TO RELATED APPLICATIONS

This application is a continuation-in-part of U.S. application Ser. No. 16/374,447, filed Apr. 3, 2019, and the entire disclosure of which is incorporated herein by reference.

This application claims priority to U.S. Provisional Application Ser. No. 63/363,594, filed Apr. 26, 2022, and the entire disclosure of which is incorporated herein by reference.

BACKGROUND

Technical Field

The inventive subject matter described herein relates to a deviation detection system for use with a power circuit.

Discussion of Art

Energy supply systems that utilize a large number of battery cells can be difficult to manage and monitor. A failure in one battery cell or module of plural cells can be undesirable and cause secondary damage in other cells within the same or different modules. Known systems for monitoring energy supply systems compare sensor measurements to preset, absolute limits or thresholds, and trigger an action/alarm condition if one or more of the sensor measurements exceed a corresponding preset limit, such as a preset temperature threshold. But, the known systems may be relatively inaccurate and/or slow to detect potential failures because a failure is not able to be detected until a preset limit is crossed. Furthermore, the known systems may provide little if any additional information that could be used for reducing secondary damage, such as the location of the failure (e.g., which specific cells of the thousands are affected) for providing service or isolating the affected section of the storage system, the type of failure (e.g., fire, bad weld, sensor malfunction, etc.), and the like. It may be desirable to have a method and/or system for the early detection of failures and additional information about the failures for protecting the energy supply system and reducing secondary damage.

BRIEF DESCRIPTION

In one or more embodiments, a system is provided that includes a first group of sensors and a control unit including one or more processors. The first group of sensors is associated with an energy storage module that includes one or more energy storage devices. The sensors in the first group may generate sensor measurements representing one or more parameters of the energy storage module. The control unit may receive the sensor measurements generated by the sensors and determine one or more of a reference value or a reference variation of a specific parameter related to the energy storage module based at least in part on the sensor measurements. The control unit may compare one or more of monitored values or monitored variations of the specific parameter, based on the sensor measurements generated by sensors of the first group, to the reference value or the reference variation of the specific parameter and detect a deviation that is greater than a designated tolerance margin.

In one or more embodiments, a method is provided that includes obtaining sensor measurements generated by a first group of sensors associated with an energy supply circuit. The energy supply circuit may include one or more components, such as energy storage devices. The sensor measurements represent one or more parameters of the energy supply circuit. The method includes comparing one or more of monitored values or monitored variations of a specific parameter related to the energy supply circuit to one or more of a reference value or a reference variation of the specific parameter. Both the one or more of the monitored values or monitored variations and the one or more of the reference value or the reference variation are based at least in part on the sensor measurements generated by the first group of sensors. The method includes detecting a deviation condition responsive to one or more of the monitored values or monitored variations deviating from the reference value or the reference variation by more than a designated tolerance margin. The method includes identifying a first sensor of the first group that generated sensor measurements on which one or more of the deviating monitored values or monitored variations are based, and estimating or predicting a cause of the deviation condition based at least in part on the sensor measurements generated by the first sensor.

In one or more embodiments, a system is provided that includes a control unit with one or more processors. The control unit may obtain sensor measurements generated by a first group of sensors associated with an energy supply circuit. The sensor measurements represent one or more parameters of the energy supply circuit. The control unit may compare the sensor measurements that represent a specific parameter of the one or more parameters to one or more of a reference value of the specific parameter or a reference variation of the specific parameter. In response to detecting that one or more of the sensor measurements deviates from the reference value or the reference variation by more than a designated tolerance margin, the control unit may identify a first sensor of the first group that generated at least some of the one or more deviating sensor measurements, estimate a cause of the deviation based at least in part on the sensor measurements generated by the first sensor, and generate a control signal to initiate one or more remedial actions based on the estimated cause.

In one or more embodiments, a system is provided that may include one or more sensors that may monitor one or more operating parameters of components of a power circuit and generate sensor measurements representing a first parameter of the one or more operating parameters. The system includes a control unit that may obtain a reference value of the first parameter based at least in part on the sensor measurements over time. The reference value may be a rate of change value. The control unit may compare rates of change of monitored values of the sensor measurements over time to the rate of change of the reference value over time, and determine a deviation condition in response to the rate of change of a first monitored value of the sensor measurements differing from the rate of change of the reference value by more than a determined tolerance margin value. The control unit may generate a control signal responsive to detecting the deviation condition to change an operating condition of at least one of the components of the power circuit.

In one or more embodiments, a system is provided that may include one or more sensors that monitor one or more operating parameters of one or more electrical power sources of a power circuit and generate sensor measurements representing at least one of the operating parameters.

The system may include a control unit including one or more processors. The control unit may determine a reference variation of a first parameter of the operating parameters over time based on the sensor measurements. The control unit may compare monitored variations between monitored values of the first parameter over time to the reference variation over time, and determine a deviation condition in response to the monitored variation between a first monitored value of the first parameter and a second monitored value of the first parameter exceeding the reference variation by more than a designated tolerance margin value. The control unit may generate a control signal responsive to detecting the deviation condition to change an operating condition of at least one of the one or more electrical power sources of the power circuit.

In one or more embodiments, a method is provided that may include obtaining sensor measurements representative of one or more operating parameters of a power circuit, and determining a reference rate of change value of a first parameter of the one or more operating parameters over time based at least in part on the sensor measurements. The method may include comparing rates of change of monitored values of the sensor measurements over time to the reference rate of change value, and determining a deviation condition in response to the rate of change of a first monitored value of the sensor measurements differing from the reference rate of change value by more than a determined tolerance margin value. The method may include generating a control signal to change an operating condition of the power circuit in response to detecting the deviation condition.

BRIEF DESCRIPTION OF THE DRAWINGS

Reference is now made briefly to the accompanying drawings, in which.

DETAILED DESCRIPTION

Figure 1:
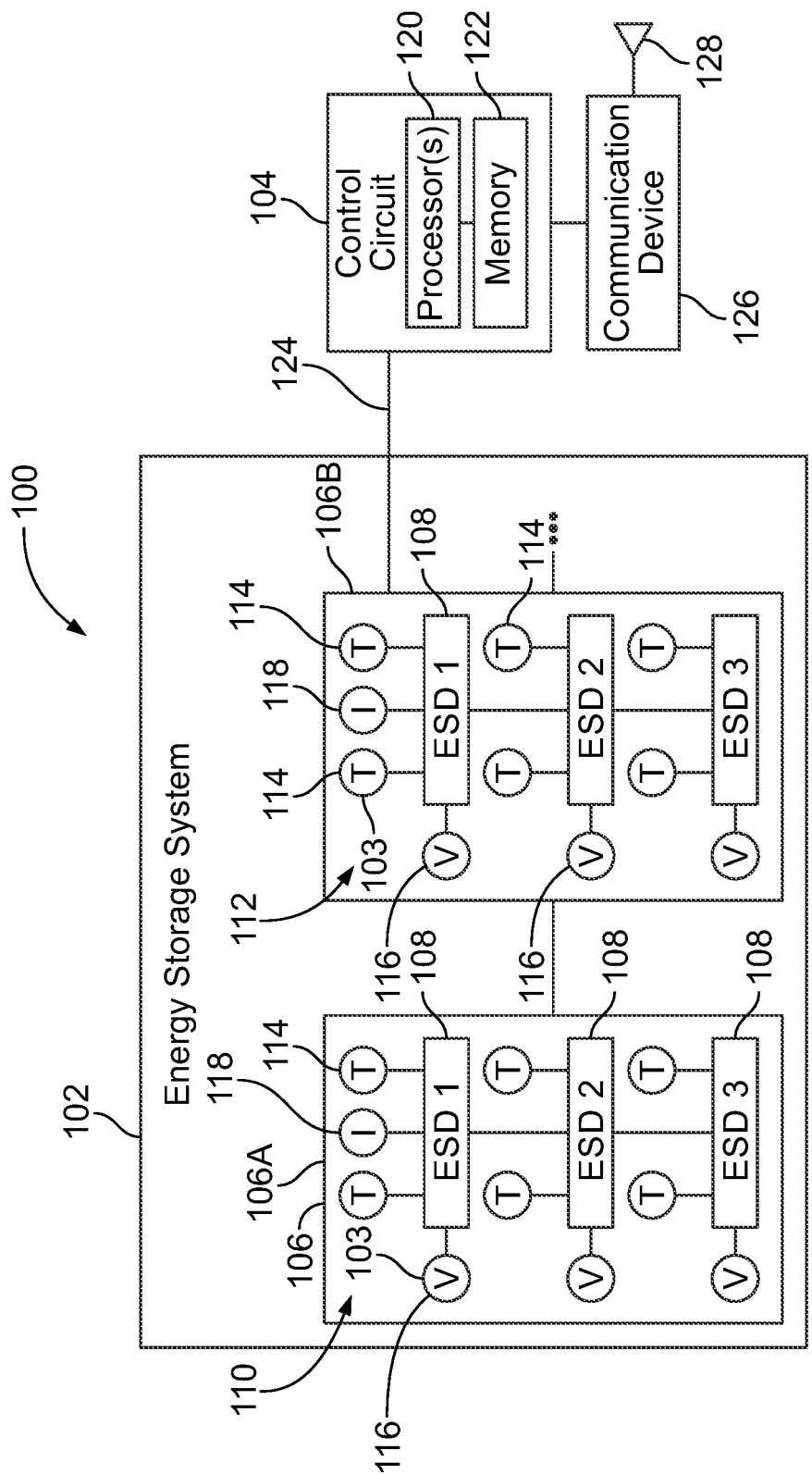
FIG. 1 is a schematic diagram of a deviation detection system according to an embodiment of the disclosure.

One or more embodiments described herein provide a system and method for deviation detection during the operation of a power circuit. The power circuit can include an energy supply system. An energy supply system can include an energy storage system, an electric charging system, an external power supply (e.g., a catenary or a third rail), and the like. Some deviation detection systems and methods described herein may be based on modeling/observing expected behavior of the power circuit, the energy storage modules, and the power supply lines. It may detect deviation conditions based on deviations between monitored behavior of the power circuit and the expected behavior. The expected behavior may be determined in the form of parameter values, parameter values over time (e.g., plot lines), changes in parameter values over time (e.g., slopes), variations in parameter values (e.g., ranges), and/or the like. The parameters used to represent the expected behavior may be measured parameters that may be directly measured by sensors and/or derived (or transformed) parameters that may be derived as a function of sensor measurements. As used herein, parameter values and parameter variations that represent the expected behavior are referred to as reference values and reference variations.

Some items within a group that experience similar operating conditions may be expected to perform similarly. For example, temperature sensors that monitor the temperature of different battery cells in the same module or power lines in a charger may be expected to generate similar temperature measurements. Using determined current levels, voltages, and the like with similar or the same equipment may expect similar thermal behavior, for example. In addition, temperature sensors in different circuits that may be exposed to similar ambient conditions, charge states, and power loads may be expected to generate similar temperature measurements. Conversely, if two energy circuits in a common vehicle experience a known difference in operating conditions, an expected (or reference) temperature difference between the two energy storage circuits may be predicted or determined. Therefore, if at least one of the temperature sensors records a temperature measurement that deviates from what may be expected, this discrepancy indicates that there may be a malfunction associated with the battery cell, the sensor, or another component of the energy supply system. Although absolute temperature may be mentioned in these examples, derived functions based on temperature may be considered in the embodiments herein, including rate of change of temperature. Furthermore, the embodiments disclosed herein consider other parameters besides temperature, such as voltage, power, current, pressure, flow rate, and the like.

A deviation condition may be detected based on excessive deviation from the expected (or reference) behavior, in contrast to known energy storage monitoring systems that detect alarm conditions based on a measured value of a parameter crossing a preset absolute limit or threshold value. The deviation detection system disclosed herein may provide earlier detection of potential failures than the past known systems. For example, if the past known system has a preset temperature threshold of 40 degrees Celsius (° C.), then the known system does not detect a potential failure until a sensor generates a temperature measurement that may be at least 40° C. But, a deviation detection system as described herein may be able to detect a potential failure before the temperature exceeds 40° C. For example, if a measured temperature value deviates from a reference (e.g., expected) value of the temperature or a reference variation (or variance) in the temperature beyond a determined tolerance margin value, the deviation detection system detects a deviation condition even if the measured temperature value may be less than 40° C. The earlier detection may enable the deviation detection system to prevent or at least reduce the extent of damage caused by a failure of one or more battery cells, fuel cells, capacitor banks, and/or failures of other components, such as sensors, plugs/connectors, transmission lines, transformers, line conditioners, and the like.

In addition to providing early detection of potential failures in the energy supply system, the deviation detection system disclosed herein may provide additional information that may be useful for locating, diagnosing, and mitigating damage and delays. For example, the deviation detection system may identify the one or more particular sensors that generated the deviating sensor measurements that triggered the deviation condition, allowing for a precise location of the potential failure. Furthermore, the deviation detection system may automatically initiate one or more responsive or remedial actions upon detecting the deviation condition. Some responsive actions may be intended to prevent or at least mitigate secondary damage from fire, thermal runaway, or the like caused by battery failure. Those responsive actions may include isolating one or more energy storage circuits by blocking electric current transfer to and from the energy storage circuit(s), initiating active cooling, initiating fire suppression, or the like. The deviation detection system may analyze the deviating sensor measurements with sensor measurements representing the same parameter and/or different parameters based on expected behavior associated with different specific fault states to estimate a cause of the deviation condition. For example, the deviation detection system may estimate that the deviation condition may be caused by a malfunctioning energy storage device (e.g., battery cell), a malfunctioning sensor, a bad weld, a short circuit, a malfunctioning cooling system, a broken tab connecting two energy storage devices, or the like.

Estimation of the cause of the deviation condition enables the deviation detection system to take, or at least suggest, failure-specific remedial actions. For example, if the cause is suspected to be a malfunctioning sensor, the deviation detection system may flag the sensor for repair or replacement and/or ignore or substitute future measurements from that sensor. On the other hand, if the cause is suspected to be a malfunctioning battery cell experiencing (or at a risk of experiencing) fire or thermal runaway, the deviation detection system may isolate the battery cell, initiate active cooling, and/or the like to prevent the spread of secondary damage from the battery cell. Therefore, instead of merely providing a generic alert once an absolute limit or threshold has been crossed, the deviation detection system described herein may provide early detection of anomalies, as well as additional information such as locations and estimated types and causes of the anomalies, that can be used to provide enhanced protection and operation of the energy supply system.

In one or more embodiments, upon detecting a deviation condition, the system may automatically take one or more immediate actions assuming a worst-case scenario. For example, the worst-case scenario may be that an energy storage circuit is on fire and/or experiencing thermal runaway. Thus, prior to estimating the cause of the deviation condition, the system may take immediate action to mitigate potential damage from fire and/or thermal runaway, such as by implementing fire suppression, electrically isolating the energy storage circuit, derating performance of the vehicle, and/or the like. Then, if it is subsequently determined that the cause of the deviation condition was a malfunctioning sensor or another cause that may be less severe than the worst-case scenario, such that there is no fire or thermal runaway, the system may cease and/or modify the immediate actions that were based on the worst-case scenario assumption. For example, by modifying the temporary actions upon eliminating fire and/or thermal runaway as the cause, the system may increase the load on the energy storage device, maintain vehicle operation, and/or the like. On the other hand, if the energy storage circuit has been determined to be at fault, then the system may maintain the temporary actions. The ability of the deviation detection system to maintain and/or alter the actions based on an estimation of the cause may be desirable over known systems. For example, a known system that detects a deviation may automatically shut down operation of the energy supply circuit, a vehicle, or the like, requiring an inspection by an operator before enabling additional operation. Such an automated shut-down may be an unnecessary over-reaction that reduces efficiency and slow the performance of a designated task, particularly if the root cause of the deviation is a minor malfunction. For example, if the root cause is determined to be a malfunctioning sensor, shutting down the vehicle for an extended period of time and may unduly delay the vehicle and/or interfere with trips of other vehicles.

According to an embodiment, the deviation detection system operates according to an algorithm. The first part of the algorithm may be determining the expected behavior under an assumption that every cell, group of cells, sensor, and/or group of sensors will not fail at the same time. The expected behavior may be developed through a physics-based model combined with operating conditions. For example, given certain characteristics of an energy storage circuit, such as the state of charge and internal impedance of the battery cells thereof, the reference voltage of the energy storage circuit can be determined. For a certain change in the stored current (e.g., per unit ampere hours), there may be some amount of expected change in voltage. In addition to, or as an alternative to, modeling the expected behavior, the expected behavior can be determined through tracking the history and operation of the energy storage circuit over time. Optionally, the expected behavior can be determined based on comparing the parameters of an energy storage device (e.g., a battery cell) to other energy storage devices in the same circuit and/or in other circuits. It may be expected that cells connected in series should all see the same directional change in voltage for a given change in per unit ampere hours. In a first non-limiting example, if voltage decreases for one cell yet increases for all other cells in a series connection, then it can be deduced that a problem exists. In another non-limiting example, if the voltage increases for one cell much faster than it increases for all other cells in the same circuit, then the deviation detection system may identify a broken weld as the cause of the deviation. Other parameters besides voltage, such as temperature, power, or the like, may be utilized in the same or other examples of the deviation detection system.

The algorithm may use multiple different parameters to estimate the cause of the deviation condition. For example, in the presence of a broken weld for an electrical connection to an energy cell, not only should the voltage increase at a faster rate, but the resistance and temperature for that cell should be greater than other cells in the same circuit or cells in another circuit carrying similar current. Combining the physics-based model with the expectation through comparisons, the deviation detection system disclosed herein can differentiate between sensor failure and an inaccurate model. Some error between reality and the model may be acceptable. Therefore, the deviation detection system incorporates expected error as well in the form of a determined tolerance margin value. The error can be due to sensor inaccuracies and design variations, such as a temperature gradient. Error can change throughout the course of an operational life of a battery cell, as the internal resistance may change over time. By determining the expected behavior of the parameters and the expected error, the deviation detection system can detect when a problem occurs, determine the root cause of the problem, and take appropriate action(s).

FIG. 1 is a schematic diagram of a deviation detection system 100 according to an embodiment of the disclosure. The deviation detection system includes a plurality of sensors 103 and a control unit 104 operably connected to the sensors 103. The sensors monitor various parameters of an energy supply system 102. The parameters measured by the sensors may include temperature, voltage, current, state of charge, charge capacity, resistance, pressure, coolant flow rate, and/or the like. A suitable coolant may be a fluid, such as a gas or a liquid.

The different parameters listed above may be measured by different sensors that are each specifically constructed for monitoring one or more particular parameters for use by the detection system. For example, temperature may be monitored by one or more temperature sensors, such as thermistors, thermocouples, resistance temperature detectors (RTDs), and the like. The temperature parameter may represent a temperature of one or more of the energy storage devices or the ambient temperature nearby one or more of the energy storage devices. The voltage may be monitored by one or more voltage sensors, such as a non-contact voltage detector. The voltage parameter may represent the voltage supply of an energy storage circuit. The current may be monitored by one or more current sensors, such as a Hall effect sensor, a fluxgate transformer sensor, and/or the like. The current parameter may represent the electric energy flowing into and/or out of an energy storage circuit. The state of charge may represent an amount of electric energy actually present within an electric energy circuit (or device thereof). The charge capacity may represent the amount of electric energy that can be stored within an electric energy circuit (or a device thereof). The state of charge and/or charge capacity may be measured by an integrated battery tester or based on sensor outputs from a voltage sensor and a current sensor. For example, the state of charge and/or charge capacity may be able to be calculated based on measured current flow and voltage output. The resistance may represent the opposition to the flow of electric current through an electric energy circuit (or a device thereof). The resistance may be measured based on sensor outputs from the voltage sensor and the current sensor by utilizing Ohm's law. The current and voltage sensors may be integrated into a multimeter to measure the resistance. The pressure may refer to the ambient pressure surrounding the energy storage circuit(s), and may be measured by pressure sensors such as pressure transducers, piezoelectric elements, and the like. The coolant flow rate may refer to the flow rate of cooling fluid, such as air, a refrigerant, a liquid, a gas (other than air), or the like, which is directed to flow across one or more electric energy circuits to absorb and dissipate heat generated by the one or more electric energy circuits. The coolant flow rate may be measured by a flow sensor, such as a moving vane meter, a hot wire mass flow sensor, a cold wire mass flow sensor, a membrane sensor, and the like.

The energy supply system provides energy for use in doing work. Work may include running auxiliaries and propelling a vehicle. The energy supply system may include multiple energy storage circuits 106. Each energy storage circuit may include one or more energy storage devices 108 ("ESD" in FIG. 1). Suitable energy storage devices may be battery cells, capacitors, or the like. The energy storage devices in each circuit may be electrically connected to one another, such as in series or parallel relationship. In the illustrated embodiment, two energy storage circuits 106A, 106B may be shown, and each of the energy storage circuits 106A, 106B has an assembly of three energy storage devices. The energy storage circuits may include more or less than three energy storage devices in other embodiments, such as only one energy storage device, six energy storage devices, ten energy storage devices, or the like. Although two energy storage circuits are shown, the energy supply system may include additional energy storage circuits, such as ten energy storage circuits, twenty-five energy storage circuits, or the like. The different energy storage circuits may be electrically connected to one another, such as in a series or parallel relationship, to define a string. Alternatively, the energy storage circuits may be electrically isolated from one another. In an alternative embodiment, the energy supply system may have only one energy storage circuit, and the single energy storage circuit may include multiple energy storage devices.

The deviation detection system may monitor the operations of the energy supply system by analyzing the sensor measurements generated by the sensors. For example, the sensors may be arranged in a first group 110 and a second group 112. The first group may be associated with the first energy storage circuit 106A, and the second group 112 may be associated with the second energy storage circuit 106B. For example, the sensors in the first group monitor various parameters of the first energy storage circuit. The various parameters of the first energy storage circuit includes parameters of each of the energy storage devices thereof. In the illustrated embodiment, the sensors in the first group include temperature sensors 114, voltage sensors 116, and a current sensor 118. A different pair of temperature sensors may measure the temperature of each of the energy storage devices, such that there may be six temperature sensors in the first group that measure the temperature of the three energy storage devices. The first group includes three voltage sensors, with each voltage sensor configured to measure the voltage across a different one of the three energy storage devices (or a collection of energy storage devices if in a parallel arrangement). The first group has a single current sensor that measures electric current transfer through the first energy storage circuit. The second energy storage circuit may be a replica of the first energy storage circuit in FIG. 1, and the second group of sensors may be a replica of the first group. The types of sensors, number of sensors, and/or placement of the sensors may be selected based on application specific parameters. For example, the first group and/or second group may include sensors to measure resistance, state of charge, charge capacity, pressure, coolant flow rate, and/or the like. Suitable sensors may be associated with at least one of the energy storage circuits of the energy supply system. The adjacency, spacing, sensitivity, and type of the sensors may be leveraged in an application to support aspects of the inventive system.

The control unit 104 may obtain and analyze sensor measurements generated by the sensors associated with the energy supply system for the purpose of monitoring the operation of the energy supply system and providing efficient, prompt remedies to address malfunctions and/or failures to limit damage. The control unit includes one or more processors 120 and associated circuitry, such as a computer processor or other logic-based device that performs operations based on one or more sets of programmed instructions (e.g., software). The programmed instructions on which the control unit operates may be stored on a tangible and non-transitory (e.g., not a transient signal) computer readable storage medium, such as a memory 122. The memory may include one or more computer hard drives, flash drives, RAM, ROM, EEPROM, and the like. Alternatively, instructions that direct operations of the control unit 104 may be hard-wired into the logic of the control unit, such as by being hard-wired logic formed in programmable gate arrays (fpga), complex programmable logic devices (cpld), and/or other hardware. In an embodiment, the control unit may be conductively connected to the sensors via a conductive pathway, such as an electrical cable 124, contactors, an optical cable, circuit traces, or the like, and the control unit obtains the sensor measurements via the conductive pathway. Optionally, at least some of the sensors may be wirelessly connected to the control unit, and may wirelessly communicate the sensor measurements to the control unit 104. The control unit obtains the sensor measurements generated by the sensors in both the first group associated with the first energy storage circuit and the second group associated with the second energy storage circuit.

The control unit determines a reference value and/or a reference variation of a specific parameter based on the sensor measurements generated by the sensors. The specific parameter may be a measured parameter that may be directly measured by one or more sensors associated with the energy storage circuits, such as temperature, voltage, current, flow rate, pressure, or the like. Optionally, the specific parameter may be a derived or transformed parameter that not directly measured by any of the sensors, but rather may be derived as a function of one or more sensor measurements. A first non-limiting example of a derived parameter may be power, which may be derived from current and voltage sensor measurements. Derived parameters may include statistical metrics, such as mean, median, mode, and the like of a measured parameter (e.g., mean of temperature) or another derived parameter (e.g., mean of power). Other non-limiting examples of the specific parameter may include RMS (root mean square) current, RMS power, harmonic current, state of charge, charge capacity, resistance, or the like. Although some examples described herein refer to a reference value and/or reference variation of a single specific parameter, the control unit may determine respective reference values and/or variations of multiple different specific parameters for detecting deviation conditions.

As described in more detail herein, the reference value and/or reference variation may be based on the sensor measurements of the sensors in the first group that monitor the first energy storage circuit, the sensor measurements of the sensors in the second group that monitor the second energy storage circuit (and any additional sensor measurements associated with the energy supply system), operating parameters of the energy supply system, inherent characteristics of the energy storage devices (e.g., cell chemistry) of the storage circuits, historical information about the energy storage circuits (e.g., operating age, state of health, etc.), and/or historical information observed from other energy storage circuits (e.g., trends). The reference value and/or variation may vary over time.

There may be several ways that the reference value can be determined for a certain parameter including, but not limited to, comparing parameters within the same circuit, within the same string, in different strings, different locomotives, by a physics-based model, by historical or experimental data, or combinations thereof. The control unit may determine multiple reference values for the same parameter using one or more of these methods. Each of these reference values will have an associated value, variance and/or confidence interval (e.g., error margin). For instance, the temperatures of cells within a circuit may be expected to have less variance than the temperatures of cells within an entire string due to the sensors being enclosed in the same packaging. The reference values for the same parameter and their associated variance/confidence intervals can be combined into a single reference value and reference variance/confidence interval through a transfer function. One example of such a transfer function may be a weighted average where larger weights may be assigned to the reference values that have less variance, or larger weighting based on source. For example, the reference value may be more heavily influenced by data within the circuit that is monitored than by data from other circuits within the string. Similarly, the data within the string (where the particular circuit is) may be weighted higher than the data from other string(s), including circuits thereof.

To monitor the operations of the first energy storage circuit, the control unit receives the sensor measurements from the sensors in the first group and determines monitored values and/or monitored variations of the specific parameter based on these sensor measurements. For example, if the reference value and/or reference variation in the specific parameter represents the control variable, the monitored values and/or variations represent the experimental variable. Like the reference values and/or variations, the monitored values and/or variations of the specific parameter may be direct sensor measurements or derived calculations based on the direct sensor measurements. In a non-limiting example, if the specific parameter may be temperature, the control unit may determine the monitored values as the temperature measurements generated by all of the corresponding temperature sensors in the first group. In another non-limiting example, if the specific parameter may be power, the control unit may determine the monitored values as the power calculations derived by multiplying current measurements times voltage measurements. The monitored variations represent differences in the monitored values. For example, a monitored variation may equal the difference in two difference power calculations related to the energy storage circuit that may be based on different voltage and current measurements.

After determining the monitored values and/or variations, the control unit may compare the monitored values and/or variations to the reference value and/or variation of the specific parameter. For example, if the specific parameter may be temperature, the control unit may compare all temperature measurements generated by the temperature sensors in the first group to the reference value and/or reference variation. If at least one of the monitored values and/or variations deviates from the reference value and/or the reference variation by more than a determined (e.g., designated) tolerance margin value or range, then the control unit detects a deviation condition. The deviation condition represents a status in which a potential failure may be detected. The term potential failure may represent a broad category of scenarios of varying severity, such as a malfunctioning sensor, a broken/damaged tab connecting energy storage devices, a bad weld, a malfunctioning cooling system, a malfunctioning energy storage device (which may experience fire or thermal runaway), or the like. Upon detecting the deviation condition, the control unit may take one or more responsive actions according to the programmed instructions, such as to notify an operator and/or isolate the energy storage circuit by blocking electric current transfer to and/or from the energy storage circuit, at least temporarily until a cause of the deviation condition may be determined and the deviation condition may be remedied.

Optionally, the control unit may be operably connected to a communication device 126 that represents a component of the deviation detection system with the control unit and the sensors. The control unit may generate one or more control signals that may be communicated by the communication device to intended recipients, such as vehicle controller devices, human operators, and/or the like. The communication device may include a transceiver (or discrete transmitter and receiver components), an antenna 128, and associated circuitry for wireless bi-directional communication of various types of messages, such as command messages, reply messages, status messages, and/or the like. The communication device may transmit messages to specific designated receivers and/or may broadcast messages. Optionally, the communication device may include circuitry for communicating messages over a wired connection, such as between multiple energy supply systems in the same vehicle or between different vehicles that are electrically couplable.

Figure 2:
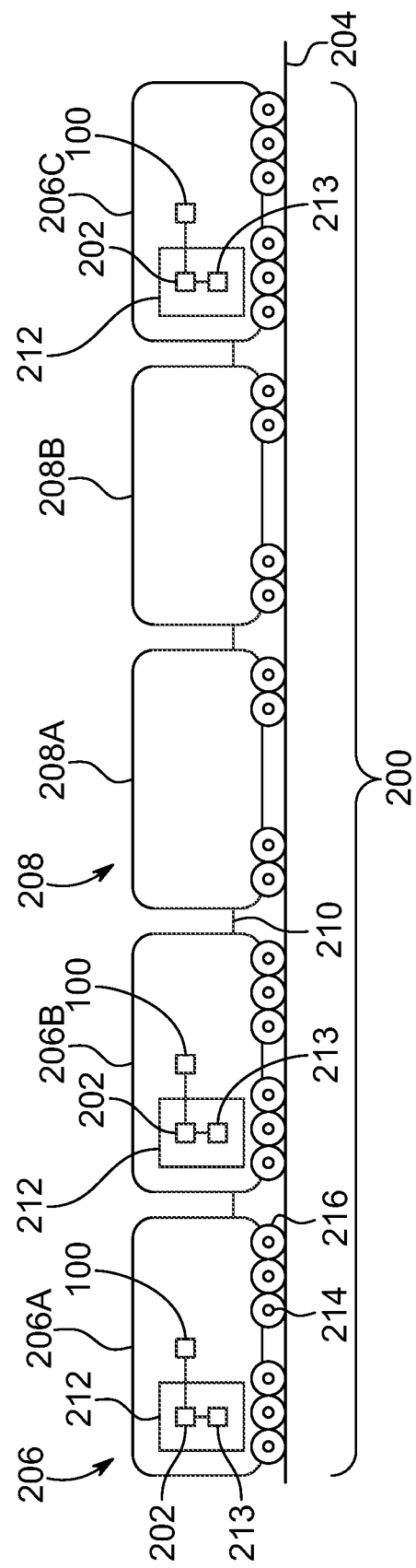
FIG. 2 is a schematic diagram of a vehicle system that incorporates the deviation detection system according to an embodiment.

FIG. 2 is a schematic diagram of a vehicle system 200 that incorporates the deviation detection system 100 according to an embodiment. The vehicle system moves along a route 204. The vehicle system in the illustrated embodiment represents a vehicle consist. Suitable vehicle consists may include a rail vehicle consist (e.g., train) having both propulsion-generating vehicles 206 (e.g., vehicles 206A-C) and non-propulsion-generating vehicles 208 (e.g., vehicles 208A-B) mechanically coupled together by couplers 210 (and may optionally include an electrical connector). In this example, the propulsion-generating vehicles may be locomotives, and the non-propulsion-generating vehicles may be railcars.

Other suitable vehicle consists may include a group of communicatively linked on-road vehicles. In one embodiment, the vehicles are remote-controlled or autonomous. The vehicle system may be formed from several vehicles that may be physically separate from each other but logically coupled with each other to enable communication among the vehicles to coordinate their movements with each. Additionally, a suitable vehicle system may be formed from a single vehicle that is propulsion-generating, instead of from multiple vehicles (whether propulsion generating or not).

Suitable propulsion-generating vehicles include respective propulsion systems 212 that generate tractive effort for propelling the vehicle system along the route. Each propulsion system may have one or more traction motors 213 operably coupled with different axles 214 and/or wheels 216 of the vehicles. The traction motors may be connected with the axles and/or wheels via one or more gears, gear sets, or other mechanical devices to transform rotary motion generated by the traction motors into rotation of the axles and/or wheels. Different traction motors may be operably connected with different axles and/or wheels such that traction motors that may be deactivated (e.g., turned OFF) do not force rotation of corresponding axles and/or wheels while traction motors that remain activated (e.g., turned ON) force rotation of the corresponding axles and/or wheels. Each propulsion system may include an energy supply system 202 that provides electrical power to the traction motors. The energy supply system on each propulsion-generating vehicle may be the same or similar to the energy supply system 102 shown in FIG. 1. For example, the traction motors in a propulsion state may be powered by electric current provided to the traction motors by the energy supply system. In a regenerative braking state, the traction motors may supply electric current generated based on the rotation of the wheels and/or axles to the energy supply system for charging energy storage devices (e.g., battery cells or the like) thereof.

The deviation detection system, including the sensors and the control unit (both shown in FIG. 1), may be disposed onboard each of the propulsion-generating vehicles to monitor operations of the energy supply system thereof. Optionally, a different discrete deviation detection system may be disposed onboard each of the three propulsion-generating vehicles. Alternatively, a single control unit (e.g., a master control unit) onboard the vehicle system may obtain sensor measurements from sensors disposed onboard different vehicles to monitor all of the energy supply systems.

While FIG. 2 illustrates the deviation detection system incorporated onto a rail vehicle consist, the embodiments described herein may be applied to other types of vehicle consists and/or vehicles other than rail vehicles, such as off-highway vehicles (e.g., mining vehicles or other vehicles that may be not designed or permitted for travel on public roadways), marine vessels, automobiles, or the like. Furthermore, the deviation detection system described herein may be utilized to monitor any large format energy supply system, even in stationary industrial, non-vehicular applications.

Figure 3:
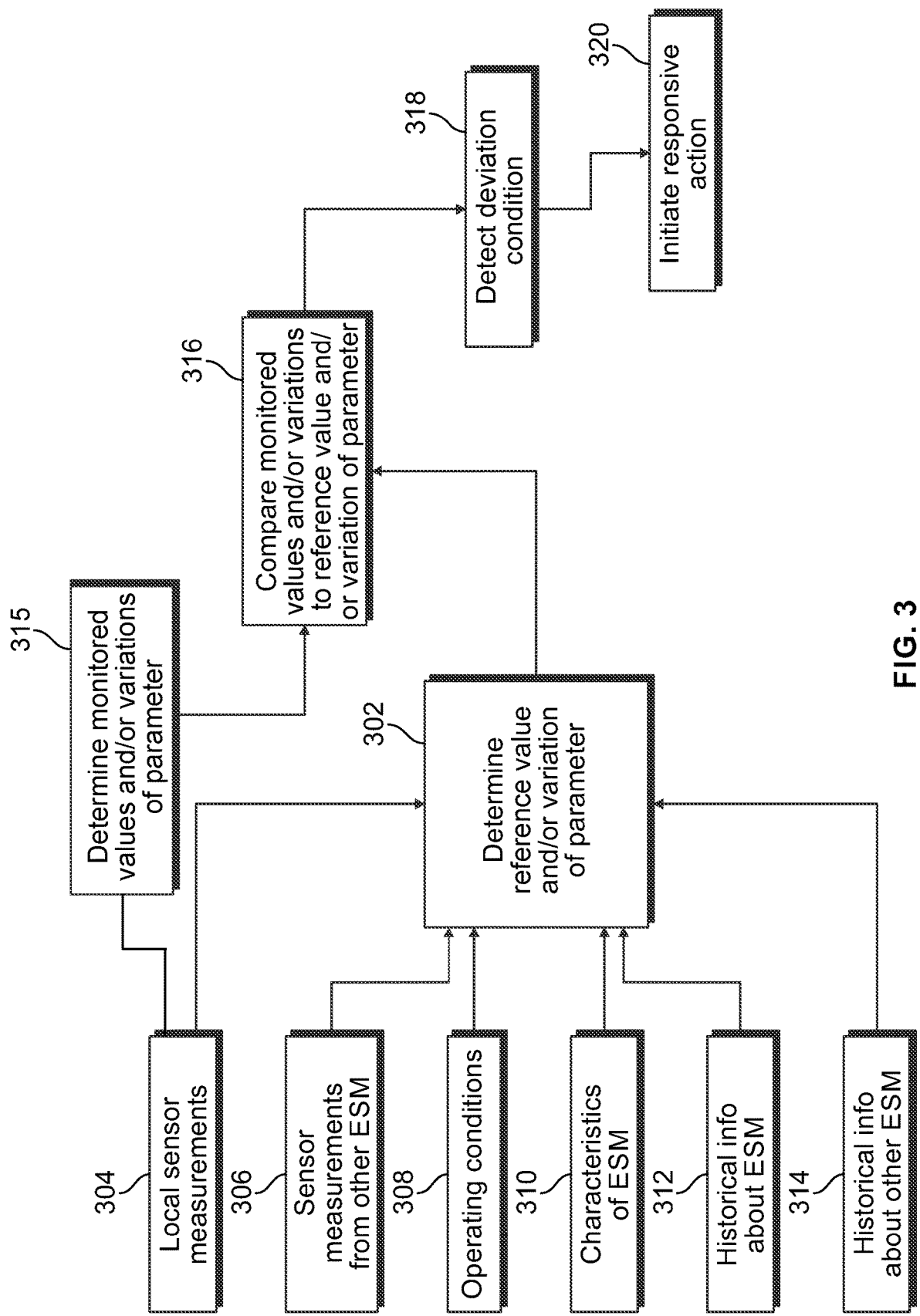
FIG. 3 is a block flow diagram that illustrates operations of a control unit of the deviation detection system according to an embodiment.

FIG. 3 is a block flow diagram that illustrates operations of the control unit of the deviation detection system according to an embodiment. At 302, the control unit determines the reference value and/or reference variation of a specific parameter. The reference value and/or variation represents expected behavior of the energy storage circuit (or energy storage device thereof) being monitored. The energy storage circuits in the same energy supply system (or even different energy supply systems) that experience similar operating conditions may be expected to perform similarly and have similar responses to common stimuli, such as a load or demand for current applied to the storage circuits. The energy storage devices within the same energy storage circuit, and across different energy storage circuits, may have the same or similar characteristics. These characteristics may include cell chemistries, charge capacities, types, age/use/health, lot number, and the like. The reference value and/or reference variation may be a numerical representation of the expected behavior.

The reference value can be a single numerical value, a numerical value over time (e.g., can be plotted on a graph as a plot line), a rate of change in a numerical value over time (e.g., a slope of a line), or the like. The rate of change of a reference value over time is referred to herein as a reference rate of change. In an example in which the reference value represents the rate of change (or slope) of temperature over time, the sensor measurements of the temperature sensors (that monitor the same or similar components in the power circuit) would be expected to have the same or similar rates of change as the reference rate of change value during a common time period.

The reference variation may represent a calculated difference between two or more data points. For example, a reference variation of 10 degrees may indicate that a group of temperature sensors associated with the same energy storage circuit should not generate temperature measurements that vary from one another by more than 10 degrees. Thus, the lowest temperature measurement should be within the reference variation (e.g., 10 degrees) relative to the highest temperature measurement. The reference variation may vary over time. The reference variation may depend on operating conditions, such as different locations in a system, different voltages in the devices, and/or the like. For example, the reference variation in temperature may be greater if it may be known that the energy storage devices have different locations relative to coolant flow than if all devices may have equal, or about equal, access to the coolant flow. The devices proximate to the coolant flow would be expected to have a lower temperature than the devices farther from the coolant flow. In another embodiment, the reference variation may represent a range of values. For example, the reference variation may be a range defined between two set points, lines, or planes, that represent a lower limit and an upper limit. The position of one or both of the upper limit and the lower limit may change over time, as well as the magnitude of the range between the upper and lower limits.

The reference value and/or variation may be based on various input data received by, or accessible to, the control unit. The input data used to determine the reference value and/or variation of a specific parameter of the first energy storage circuit, for example, may include local sensor measurements 304, sensor measurements 306 from other energy supply circuits, operating conditions 308, inherent characteristics 310 of the energy supply circuit, historical information 312 (such as about the first energy storage circuit or other components of the energy supply circuit), and/or historical information 314 about other energy supply circuits.

The local sensor measurements 304 represent raw data generated by the sensors associated with the first energy storage circuit. Optionally, the control unit may filter out or substitute some of the sensor measurements that have low quality, such as a low signal-to-noise ratio or a clearly false reading (e.g., temperature measurements from a sensor that do not change over an extended period of time while it may be known from other sensors that the temperature may be changing). If the specific parameter may be temperature, the control unit may utilize the sensor measurements from all six of the temperature sensors associated with the first energy storage circuit shown in FIG. 1.

The sensor measurements 306 from other energy storage circuits refers to sensor measurements from the second group of sensors associated with the second energy storage circuit, and may refer to sensor measurements from other energy storage circuits in the same or different energy supply system. For example, to determine the reference value and/or variation of temperature, the control unit may obtain and compile temperature measurements from all (or a majority) of the temperature sensors in the entire energy supply system.

The operating conditions 308 refer to present ambient conditions and operations of the first energy storage circuit. For example, operating conditions may include ambient temperature, ambient air flow, pressure, humidity, and the like, in the environment surrounding the first energy storage circuit. The operating conditions may include active cooling and/or heating rates. Battery state may be another operating condition, and may refer to a state of charge of each energy storage device of the circuit, a present charge transfer operation of the circuit such as supplying electric current or receiving electric current, and/or a present load or current demand on the circuit. The load on the energy storage circuit may represent a rate (e.g., ampere hour rate) at which the energy storage circuit supplies current to a traction motor or to an auxiliary motor. Another operating condition may be vehicle state (e.g., locomotive state for the rail vehicle application), which may refer to whether the vehicle on which the deviation detection system may be disposed may be braking, dynamically braking, coasting, accelerating, stationary, shut down, idling, charging, discharging, refueling, and/or the like.

The characteristics of the energy supply circuit refer to inherent physics-based characteristics. Suitable characteristics may include the chemistry of the energy storage devices (e.g., cell chemistry), the type and/or model of the energy storage devices, modeled thermal characteristics of the energy storage devices, and the like. Other suitable characteristics may include features of the energy supply system, such as the gauge of power transmission lines, the distance between the current collector and the current source, The modeled thermal characteristics may refer to heat generated during operation.

The historical information about the energy supply circuit may refer to operating ages of the energy supply circuits components and/or their states of health. For example, the resistance of an energy supply circuit may be expected to gradually increase over the operational lifetime. The state of health may refer to a condition of the energy supply circuits, which may factor in the operational life, capacity of the energy supply circuits, present state of charge, available voltage or current, and/or the like. For example, a fully charged energy storage device may be more likely to experience thermal runaway than a partially depleted energy storage device because of the greater amount of stored energy. Likewise, a power supply line with frayed insulation may be more susceptible to arcing or shorting.

The historical information about other energy supply circuits may refer to observations and trends based on the performance of the energy supply circuits, whether in the same energy supply system or a different energy supply system from the first energy supply circuit. The other energy supply circuits may be similar to the first energy supply circuit, such as including the same number and/or type of energy storage devices as in the first circuit. As an example, the information may include thermal heating rates of the other energy supply circuits observed in response to specific stimuli, such as ambient conditions and loads applied on the energy supply circuits.

The control unit may utilize some or all of the input data 304, 306, 308, 310, 312, 314 for determining the reference value and/or variation in the specific parameter. For example, the control unit may plug the operating conditions, the inherent characteristics of the energy supply circuit, and the historical information about the energy supply circuit into a physics-based computational model. The physics-based computational model may be a computer program that generates the reference value and/or reference variation in the specific parameter based on an algorithm that includes multiple calculations utilizing the input data as variables. The physics-based model may utilize additional information, such as the local sensor measurements, the sensor measurements from other energy supply circuits, and/or historical information about other energy supply circuits.

As described above, the specific parameter may be derived from one or more functions and other known relationships based on one or more measurements, such that the specific parameter may not be directly measured by the sensors. Non-limiting examples of derived specific parameters include power, RMS current, harmonic spectrum, bias, resistance, statistical metrics (e.g., mean, median, mode, standard deviation, etc.), and the like. In a non-limiting example, the specific parameter may represent a statistical metric, and the control unit may compile all sensor measurements representing the specific parameter generated by the sensors that monitor the energy supply system. Thus, for temperature, the control unit may compile the sensor measurements generated by the temperature sensors associated with all of the energy supply circuits in the system. Optionally, the control unit may narrow the scope of compiled sensor measurements to the sensor measurements generated by the particular sensors associated with the same energy supply circuit or the same energy supply device. The control unit may determine the reference value and/or variation by performing a statistical calculation on the compiled sensor measurements. For example, the control unit may compute a reference value of temperature as the average (e.g., mean), median, or other designated value of the complied temperature measurements. Furthermore, the control unit may arrange the sensor measurements in a distribution from low to high, and may determine the reference variation (or range) of a specific parameter by selecting the measurement values at designated percentiles of the distribution as the upper and lower limits that define the bounds of the reference variation. For example, if the designated percentiles are 40% and 60%, the control unit may designate the sensor measurement in the distribution that represents the $40^{th}$ percentile as the lower limit and may designate the sensor measurement in the distribution that represents the $60^{th}$ percentile as the upper limit. The control unit may determine the reference value and/or variation of the specific parameters by other processes in other embodiments.

The control unit may determine the reference value and/or variation for each of multiple different specific parameters of the energy supply circuit. For example, the control unit may determine a reference value and/or variation for temperature, a different reference value and/or variation for power, a different reference value and/or variation for RMS current, and/or the like.

At 315, the monitored values and/or variations of the specific parameter may be determined. The monitored values and/or variations may be based on the local sensor measurements (at 304) of the sensors associated with the specific energy supply circuit being analyzed. As described above, the specific parameter may represent a measured parameter, such as temperature, current, voltage, and/or the like, or a derived parameter, such as power, mean temperature, resistance, RMS current, and/or the like. In an embodiment, the monitored values and/or variations may be determined without reference to external sources, such as operating conditions, historical information, and sensor measurements from other energy supply circuits.

At 316, the control unit compares the monitored values and/or variations of the specific parameter to the reference value and/or variation of the specific parameter to determine an extent and/or rate of deviation. The comparison may be performed for the purpose of detecting outlier sensor measurements that could indicate a component failure, such as a battery cell on fire or experiencing thermal runaway. The monitored behavior of the energy supply circuit, based on actual measurements generated by the sensors, may be compared to the expected behavior.

The comparison may incorporate a determined (e.g., designated) tolerance margin value that may be designed to accommodate variances (e.g., expected error) due to sensor accuracy, variances due to different ages of the sensors, gradients due to discrepancies in the packaging conditions and/or locations of the energy supply devices, variances in the quality of battery cell-to-cell connections, and the like. The tolerance margin value may be a fixed preset range, such as +/−2%, 5%, or 10% of the reference value or a preset number of degrees of a standard deviation from the reference value (e.g., within a standard deviation of 2 degrees). For the temperature parameter, the tolerance margin value could be set at a percentage or a number in units of degrees, such as +/−2 degrees, 4 degrees, 6 degrees, or 10 degrees from the reference temperature value. For a reference rate of change value, the tolerance margin value may be a fixed range of rates of change (e.g., slopes), either in units of rate of change or percentage, above and below the current rate of change of the reference value. Optionally, the tolerance margin value may be dynamic, and a function of other conditions, such as current, age, and the like. For example, the tolerance margin value may change and adjust based on an amount of current through the energy supply circuit. In the presence of low current rates, the tolerance margin value may be narrower than in the presence of greater current rates due to variables such as resistances that may be affected by current. In another example, the tolerance margin value may increase (e.g., the margin broadens) over time as the energy supply circuit ages, as it may be expected that the energy supply devices would behave closer to the expected during the earlier stages of life than the later stages of life. The determined tolerance margin value is also referred to herein as a designated tolerance margin.

The designated tolerance margin optionally may apply to the reference variation. For example, if the reference variation between temperature measurements may be 10 degrees, the designated tolerance margin may expand the acceptable range of variation to 11 or 12 degrees. Thus, if a measured variance between two temperature measurements may be 10.5 degrees, the control unit may determine that the variance does not violate the reference variation. Even though the comparisons described may be in terms of individual sensor value or individual transformed value, it may be understood a two or three-dimensional vector comparison (like a line or a plane) may be contemplated.

At 318, the control unit may detect a deviation condition in response to detecting one or more outlier or deviating monitored values and/or variations. The deviating monitored values and/or variations represent monitored values and/or variations (based on the local sensor measurements 304 generated by one or more sensors associated with the first energy supply circuit) that deviate from the reference value and/or variation by more than the designated tolerance margin. It may be recognized that these deviating monitored values and/or variations do not include the sensor data that was previously filtered out and/or substituted.

After the deviation condition may be detected, the control unit initiates one or more responsive actions 320. The responsive actions 320 may include at least temporarily changing operating conditions of the energy supply circuit, such as blocking electric current transfer to and from the energy supply circuit to isolate the energy supply circuit from other circuits (e.g., the second circuit). For example, if the energy supply circuit may be on fire or has one or more energy supply devices experiencing thermal runaway, isolating the energy supply circuit may help prevent the spread of damage, such as thermal runway, to the other energy supply circuits. The responsive actions may include adjusting a non-zero rate of electric current transfer of the circuit, inducing a designated load applied on the circuit, adjusting an ambient temperature surrounding the circuit, adjusting an air flow rate around the circuit, initiating active cooling, initiating fire suppression, flagging the circuit for repair and/or replacement, derating or otherwise changing operations of the vehicle on which the energy supply system may be installed, notifying a human operator, and/or the like. The control unit may automatically generate a control signal to initiate one or more of these responsive actions upon detecting the deviation condition.

The control unit may automatically initiate one or more temporary actions based on a worst-case scenario upon detecting the deviation condition. In an embodiment, the worst-case scenario represents a thermal runaway and/or fire to an energy supply device, which has the potential to spread to other devices in the same or different circuits causing significant permanent damage and risk of harm. Therefore, the control unit may initiate one or more temporary actions associated with thermal runaway and/or fire upon detecting the deviation condition, even if the actual cause may be not as severe. The temporary actions may include increasing active cooling, initiating fire suppression, electrically isolating the energy supply circuit from other circuits, reducing a load on the energy supply system, derating vehicle tractive efforts, notifying an operator, and/or the like.

In an embodiment, the control unit may determine which of the sensors generated the sensors on which the deviating monitored values and/or variations may be based, and may flag these sensors. Furthermore, the control unit may estimate a cause of the deviation condition based at least in part on sensor measurements generated by these particular sensors. As used herein, the cause of the deviation condition may include identification of components and/or conditions of the components. For example, the control unit may differentiate the cause as one or more of a bad weld, a malfunctioning energy supply device, a malfunctioning sensor, a broken tab connecting two energy supply devices, and/or the like. After estimating the cause, the control unit may tailor the responsive actions based on the particular estimated cause. For example, if the estimated cause may be a malfunctioning sensor, then the control unit may flag that sensor for repair or replacement, notify the operator, substitute the sensor, or the like. In addition, because a malfunctioning sensor may be not the worst-case scenario, the control unit may cease the performance of the temporary remedial actions based on the worst-case scenario. For example, the control unit may increase the load on the energy supply system, allow for increased performance of the vehicle, slow or stop active cooling, stop fire suppression, and/or the like. In another example, if the estimated cause may be a malfunctioning energy supply device, to prevent or prohibit the spread of secondary damage from fire or thermal runaway, the control unit may extend performance of the temporary remedial actions based on the worst-case scenario, such as maintaining electrical isolation of the energy supply devices and/or circuits at issue, maintaining active cooling, maintaining fire suppression, and/or the like.

Figure 4:
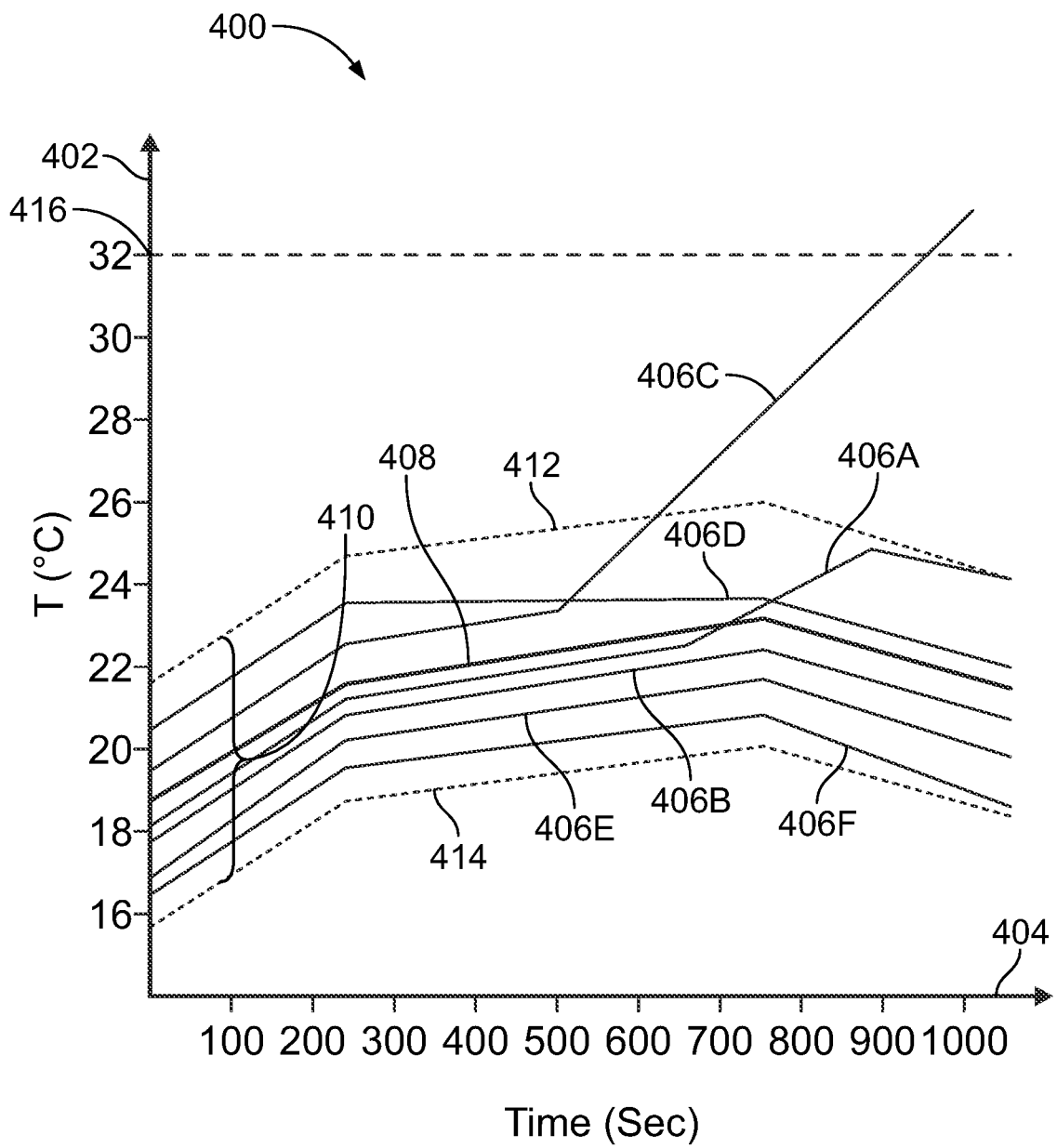
FIG. 4 is a graph plotting sensor measurements generated by temperature sensors associated with an energy storage module according to an embodiment.

FIG. 4 is a graph 400 plotting sensor measurements generated by temperature sensors associated with an energy supply circuit (e.g., the temperature sensors 114 shown in FIG. 1) according to an embodiment for easy understanding. The graph includes a vertical axis 402 representing temperature in units of degrees Celsius and a horizontal axis 404 representing time in units of seconds. The graph includes six plot lines 406A-F that represent example sensor measurements generated by each of the six temperature sensors associated with the energy supply circuit. The energy supply circuit may be either of the first or second energy supply circuits 106A, 106B shown in FIG. 1. A first plot line 406A represents temperature measurements generated by one of the temperature sensors associated with the first energy supply device of the circuit, and a second plot line 406B represents temperature measurements generated by the other temperature sensor associated with the first energy supply device. A third plot line 406C represents temperature measurements generated by one of the temperature sensors associated with the second energy supply device, and a fourth plot line 406D represents temperature measurements generated by the other temperature sensor associated with the second energy supply device. The fifth and sixth plot lines 406E, 406F represent measurements generated by the two temperature sensors associated with the third energy supply device.

The graph 400 includes a plot line 408 representing the reference (or expected) temperature (e.g., value) over time. The reference temperature line may be bordered above and below by a designated tolerance margin 410. The designated tolerance margin 410 extends above the reference temperature line to an upper line 412, and below the reference temperature line to a lower line 414. In the illustrated embodiment, the designated tolerance margin may be +/−3 degrees from the reference temperature line. For example, when the reference temperature line may be at 22° C. at around 400 seconds, the upper line may be at 25° C. and the lower line may be at 19° C. Although the designated tolerance margin may be static in the illustrated graph, as described above the tolerance margin may be dynamic and may vary over time based on operating conditions, age, etc. Furthermore, although the tolerance margin may be represented by two-dimensional plot lines in the graph, the tolerance margin may be represented in three dimensions along planes, such as if the margin may be a function of multiple parameters.

As shown in the graph, at 100 seconds, all six temperature measurements 406A-F may be within the designated tolerance margin of the reference temperature value. At 500 seconds, something causes the third plot line 406C to indicate a fairly consistent temperature increase, which differs from the other plot lines and the reference temperature line. The third plot line 406C crosses an absolute threshold 416 at the designated temperature of 32° C. at around 900 seconds. A conventional battery monitoring system may detect a deviation at time 900 seconds in response to the third plot line crossing the threshold. The deviation detection system disclosed herein may provide earlier detection of anomalies. For example, the control unit may detect a deviation condition in response to the third plot line deviating from the reference temperature line by more than the determined tolerance margin value. In the illustrated graph, that occurs at or around 600 seconds as the third plot line crosses the upper line. Therefore, the control unit may detect a deviation condition, and initiate responsive actions, at or around 600 s, which is minutes before the deviating temperature measurements exceed the designated threshold (at 900 s). The advance notice provided by the deviation detection system may prevent or reduce the spread of damage relative to waiting until the threshold is crossed prior to taking action.

In an embodiment, the deviation condition may be detected by the deviation detection system even before the third plot line crosses the tolerance margin value depicted in the graph. For example, the control unit may monitor the rates of change of the temperature values relative to the reference rate of change, and may determine that the rate of change of the third plot line differs from the reference rate of change value by more than a determined threshold margin value between 500 s and 600 s. With respect to rate of change, the threshold margin value may be different than the threshold margin value shown in FIG. 4. For example, the determined threshold margin value for rate of change may be in units of the monitored parameter over time, such as temperature over time. Optionally, the determined threshold margin value may be a +/− percentage of the reference rate of change value. As shown in FIG. 4, the control unit may determine that the rate of change (e.g., slope) of the third plot line deviates from the rate of change of the reference temperature value over time (e.g., line) by more than the designated threshold margin between 500 s and 600 s, indicating a deviation condition.

The graph 400 indicates that on or around 650 seconds, the slope of the first plot line 406A changes and deviates from the slope of the reference temperature line. For example, the first plot line indicates a faster temperature increase than the reference temperature line. Although the first plot line does not deviate from the reference temperature line by more than the designated tolerance margin, the control unit may detect a deviation condition based on the deviation in the slopes between the first plot line and the reference temperature line. Additionally, or alternatively, the control unit may detect a deviation condition based on the variation between the first plot line and one or more of the other plot lines that exceeds a reference variation. For example, the control unit may determine a reference variation of 3° C. between the sensor measurements of the temperature sensors associated with the same energy supply device (incorporating any designated tolerance margin). The first and second plot lines 406A, 406B represent the sensor measurements of the two temperature sensors associated with the same energy supply device. The graph indicates that the first plot line varies from the second plot line by more than 3° C. at some time between 800 and 900 seconds. Thus, the control unit may detect the deviation condition in response to the variation between the first and second plot lines exceeding the reference variation (even though the first plot line remains within the designated tolerance margin of the reference temperature line).

The graph indicates that the deviation condition may be detected based on various characteristics of the sensor measurements over time, such as value, rate of change in value (e.g., slope), variation in sensor measurements, and/or the like. The deviation condition may be detected independent of any of the sensor measurements exceeding a preset threshold, such as the threshold shown in the graph. For example, even if the third plot line in an alternative embodiment were to level out after exceeding the upper line such that the line never exceeds the threshold, the deviation detection system may be able to detect the deviation condition based on the value of the temperature, the slope of the plot line, a variation between the plot line and other monitored temperature plot lines, and/or the like. The deviation detection system may be configured to detect noisy sensors and/or broken sensors based on the measurements. For example, the plot line generated based on the measurements from a noisy sensor may fluctuate more than plot lines based on measurements from more precise sensors. In addition, broken sensors may provide uniform, unchanging measurements, which would be depicted as a horizontal line in the graph. In response to detecting noisy and/or broken sensors, the control circuit may ignore and/or substitute for these sensors.

Although the graph plots temperature measurements by the temperature sensors, it may be understood that the deviation conditions can be detected based on other types of parameters, such as current, voltage, state of charge, charge capacity, pressure, coolant flow rate, and any derived or transformed measurements (e.g., power, RMS current, resistance, etc.), in addition to, or instead of, temperature.

Figure 5:
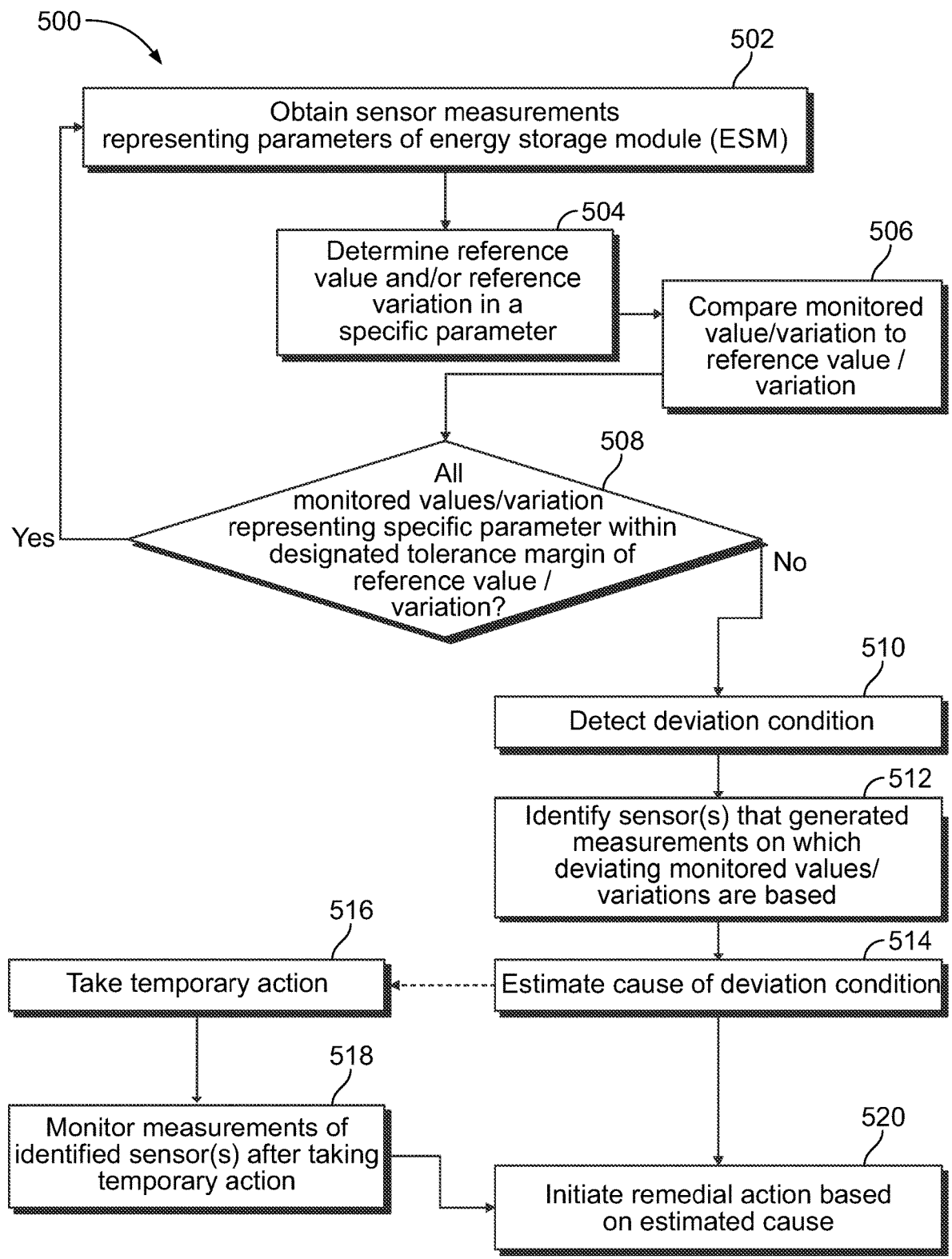
FIG. 5 is a flow chart of a method for detecting and responding to deviation conditions in an energy supply system according to an embodiment.

FIG. 5 is a flow chart of a method 500 for detecting and responding to deviation conditions in an energy supply system according to an embodiment. The method may be performed in whole or in part by the control unit 104 shown in FIG. 1, including the one or more processors thereof. Optionally, the method may include additional steps, fewer steps, and/or different steps than the illustrated flow chart.

With additional reference to FIGS. 1 through 4, the method begins at step 502, at which sensor measurements representing parameters of an energy supply circuit may be obtained. The sensor measurements may be generated by a first group of sensors associated with the energy supply circuit. The energy supply circuit includes one or more energy supply devices, such as, but not limited to, battery cells. The sensor measurements may be obtained directly from the sensors or by accessing the sensor data from an electronic storage device, such as a memory, a server, or the like.

At step 504, a reference value and/or reference variation in a specific parameter of the parameters may be determined. For example, the specific parameter may be temperature, current, voltage, resistance, state of charge, capacity, or the like. The reference value and/or variation may be determined based on the sensor measurements generated by the first group of sensors associated with the energy supply circuit, sensor measurements generated by a second group of sensors associated with at least a different, second energy supply circuit, inherent characteristics of the energy supply circuit (and devices thereof), operating conditions of the energy supply circuit, and/or historical information about the energy supply circuit or about other energy supply circuits.

At step 506, monitored values and/or variations representing the specific parameter, which may be based on the obtained sensor measurements from the sensors in the first group associated with the energy supply circuit, may be compared to the reference value and/or the reference variation of the specific parameter. The monitored values and/or variations based on the sensor measurements of each of the relevant sensors in the first group may be individually compared to the reference value and/or variation. For example, if the specific parameter may be voltage, the voltage measurements of each of the voltage sensors in the first group may be compared to the reference value and/or variation. In another example in which the specific parameter may be power, the voltage and current measurements of the voltage sensors and the current sensor may be used to derive power values and/or variations that may be each compared to the reference power value and/or variation.

At step 508, it may be determined whether all of the monitored values and/or variations that represent the specific parameter are within a designated tolerance margin of the reference value and/or variation of the specific parameter. If none of the monitored values and/or variations deviate from the reference value and/or variation by more than the designated tolerance margin, then the answer may be "yes" and the method returns to step 502. If, on the other hand, at least one of the monitored values and/or variations deviates from the reference value and/or variation by more than the tolerance margin, then the answer may be "no" and the method continues to step 510.

At step 510, a deviation condition may be detected in response to determining that one or more of the monitored values and/or variations may be deviating monitored values and/or variations that deviate from the reference value and/or variation by more than the tolerance margin. The deviation condition indicates that there may be a potential fault or malfunction in one or more components, such as an energy supply device, an electric bus, a sensor, a weld, a tab connecting batteries, or the like. At step 512, one or more sensors of the first group may be identified that generated at least some of the sensor measurements on which the deviating monitored values and/or variations may be based. For example, the sensor measurements may have data tags that indicate the source of the measurement (e.g., which sensor generated the measurement). The first sensor may be identified based on the data tag associated with a deviating monitored value and/or variation. Multiple sensors may be identified if the deviating monitored values and/or variations are based on measurements generated by different sensors.

At step 514, a cause of the deviation condition may be estimated. The cause of the deviation condition may be estimated at least in part on the sensor measurements generated by the first sensor and other identified sensors. For example, the cause of the deviation condition may be estimated by analyzing the sensor measurements generated by the first sensor with (i) sensor measurements representing the same parameter generated by other sensors in the first group, (ii) sensor measurements representing another parameter generated by other sensors in the first group, and/or (iii) sensor measurements (representing the same parameter and/or a different parameter) generated by a different group of sensors associated with a different energy supply circuit. For example, if the specific parameter is temperature, the outlier temperature measurements generated by one or more temperature sensors in the first group may be analyzed with non-outlier temperature measurements generated by other temperature sensors in the first group, with voltage measurements generated by the voltage sensors in the first group, with current measurements generated by the current sensor of the first group, and/or with temperature, voltage, and current measurements generated by the different sensors of the second group. The cause of the deviation condition may be estimated based on observed trends and relationships in the sensor measurements that are analyzed, as described in more detail herein.

Optionally, the cause of the deviation condition may be estimated by taking a temporary action at step 516 and observing the effects of the temporary action. The temporary action may include changing at least one operating condition of the energy supply circuit, at least for a designated period of time. The control unit may initiate the temporary action by generating a control signal to change the operating condition(s). The control signal may be communicated to intended recipients by the communication device. For example, the temporary action may include electrically isolating the energy supply circuit from other circuits in the energy supply system by blocking electric current transfer to and from the energy supply circuit. The energy supply circuit may be isolated by opening electrical switches to break conductive paths between the circuit and adjacent circuits. Isolating the circuit may help to block the spread of damage if it turns out that one or more of the energy supply devices are on fire and/or experiencing thermal runaway. Once the energy supply circuit is disconnected from other circuits, the temperature of the one or more energy supply devices of the circuit may be expected to move towards the ambient temperature.

Another temporary action may be to initiate, turn off, and/or adjust a cooling or heating medium, such as air conditioning, to change the ambient temperature. If the energy supply devices is not under a load (e.g., is not currently supply electrical power to a load), the devices may be expected to approach the new ambient temperature over time. Yet another optional temporary action may be to adjust an air flow rate around the circuit, such as by turning on, turning off, or modifying activity of fans or pumps. While the energy supply devices is under a load, turning off the fans and/or pumps may be expected to cause a rise in temperature of the devices, and turning on the fans and/or pumps may be expected to cause a decrease in temperature (if the ambient temperature is lower than the temperature of the devices).

Still other temporary actions may include inducing a designated load on the energy supply circuit and/or adjusting a non-zero rate of electric current transfer into or out of the energy supply circuit. The temporary action may be taken for a designated amount of time. The designated amount of time may be five minutes, thirty minutes, or the like. Optionally, the designated amount of time may extend until the cause of the deviation condition may be estimated. For example, if the cause may be estimated to be a bad sensor, then the temporary action of providing active cooling may be ceased because there may be little if any risk of fire or overheating energy supply devices due to a bad sensor.

At step 518, the sensor measurements generated by the identified sensors (which produced the outlier monitored values and/or variations) may be monitored after taking the temporary action. These subsequent post-action measurements of these sensors may be compared to the pre-action sensor measurements generated by the sensors prior to taking the temporary action to determine the effect of the temporary action on the sensor measurements. For example, if the post-action measurements are consistent with the pre-action measurements even though the change in the operating condition constituting the temporary action would have been expected to alter the measurements, then the cause of the deviation condition may be a malfunctioning sensor. Thus, if temperature measurements of a temperature sensor do not change over time in the presence of active cooling and/or isolation of the circuit that would be expected to cool the circuit, then the control unit may estimate that a temperature sensor may be malfunctioning.

In another example, the post-action measurements of an identified sensor may be compared to the measurements of other sensors that may be assumed to be properly functioning. If the post-action measurements are consistent with the measurements of the other sensors, then the identified sensor may be estimated to be properly functioning, such that the energy supply device or an associated component may be malfunctioning, broken, or at fault. Additional scenarios for estimating the cause of a deviation condition may be described below.

At step 520, after estimating the cause of the deviation condition, a responsive or remedial action may be initiated based on the estimated cause. For example, if a sensor is estimated by the control unit to be bad (e.g., malfunctioning or non-functioning), then the control unit may generate a control signal to flag that sensor for replacement, to substitute for that sensor when performing subsequent monitoring, to notify an operator that the sensor may be malfunctioning (e.g., and that the energy supply devices may be properly functioning), to cease temporary actions taken to limit thermal-related damage such as active cooling and/or isolating the energy supply circuit, and/or the like. In another example, if the control unit estimates that an energy supply device of a circuit may be malfunctioning, then the control unit may generate a control signal to extend the performance of temporary actions taken to limit thermal-related damage, flag the circuit for replacement of one or more energy supply devices thereof, notify the operator, derate the performance of a vehicle that incorporates the energy supply system, initiate fire suppression, and/or the like.

Various non-limiting example scenarios may be provided below that indicate how the control unit may be able to estimate a cause of a deviation condition based on analyzing sensor measurements. The examples below refer to battery cells, but the embodiments described herein may not be limited to battery cells.

In a first temperature example, if only one cell temperature sensor consistently heats up more than other temperature sensors for that cell, then the control unit may estimate that the cause of the deviation may be a bad weld. In response, the control unit may ignore the bad weld, notify the operator, continue to operate, derate performance of the energy supply system, and/or shut down the energy supply system, depending on the severity of the bad weld.

In a second temperature example, if the control unit detects that one cell temperature sensor may be out of range high, and neighboring sensors may be within normal range, the control unit may isolate the circuit such that no load may be on the circuit. If the temperature measurements generated by the one sensor remain out of range high after isolating the circuit, then that sensor may be malfunctioning. In response, the control unit may ignore the measurements of that sensor or substitute for that sensor in later monitoring algorithms.

In a third temperature example, if an unexpected rise occurs in two or more temperature sensors and/or if a temperature in a vent duct spikes, then the control unit may estimate that one or more of the battery cells may be heating up. Depending on the severity, the control unit may ignore the temperature increase, warn the operator and continue to operate, derate the energy supply system, shutdown the energy supply system, flag the one or more cells for replacement, initiate fire suppression, discontinue charging, reduce the voltage of the charging, and/or initiate active cooling.

In a fourth temperature example, if the temperature measurements generated by the temperature sensors are moving, as a common trend, away from a set ambient temperature (e.g., based on a cooling/heating medium) in an insulated room, then the cooling/heating medium may be malfunctioning. In response, the control unit may notify an operator that the cooling/heating medium may be not working properly and may shutdown and prevent further use of the cooling/heating medium.

In a fifth temperature example, if a mean circuit temperature and cell group temperatures have reached a consistent threshold over time (e.g., from history), then the control unit may estimate that the energy supply circuit may be at the end of life. In response, the control unit may schedule the circuit for replacement and may prevent further use thereof.

In a first voltage example, if the monitored voltage of one cell or a power line increases or decreases under load faster than other cells or power lines based on the voltage measurements generated by the voltage sensors, then the control unit may estimate that a tab of the cell may be broken or damaged, insulation may be worn or cracked in the power line, or a connector is not securely engaged. In response, the control unit may ignore the broken cell tab, derate the energy supply circuit, reduce the voltage being used, isolate the cell or power line, and/or shut down the energy supply circuit.

In a second voltage example, a malfunctioning sensor can be detected by comparing a voltage measurement of a circuit to voltage measurements of individual cells of the circuit and identifying a discrepancy or deviation. In response, measurements by the malfunctioning sensor may be ignored or substituted in additional monitoring algorithms.

In a third voltage example, by comparing the voltage measurement of a circuit or a string of circuits to a sum of the voltages of the cells thereof and identifying a discrepancy, the control unit may detect a broken measuring card. In response, one or more of the circuits may be flagged for replacement.

In a fourth voltage example, if the cell voltage maximum-to-minimum range for a given circuit or string of plural circuits may be large, then there may be an imbalance. In response, the control unit may derate performance of the energy supply system and/or perform cell balancing.

In a fifth voltage example, excessive discharge can be detected by tracking the slope of voltage measurements while the circuit is not under load. Before turning off the energy supply system, the voltage, temperature, and time may be recorded. Upon the energy supply system coming back online, the voltage, temperature, and time of the same circuit may be compared to the recorded values to determine if there may be excessive discharge. If there is excessive discharge, the circuit may be flagged for replacement.

In a sixth voltage example, if neighboring cells or circuits have different voltages during a common time period while the energy supply system is off-line, such as one increasing and the other decreasing, then the control unit may detect a short circuit. In response, the control unit may notify an operator, mechanically disconnect the cells or circuits, and/or flag the cells or circuits for replacement.

In a seventh voltage example, a failed fuse, connection device, current sensor, or other component may be detected. The control unit may detect a failed fuse if a current measurement generated by a current sensor may be relatively high, and a monitored voltage of a circuit or string of circuits suddenly drops to zero. A failed connection device can be detected if a voltage measurement does not increase or decrease when expected. A malfunctioning current sensor can be detected if the voltage measurements increase and/or decrease when expected, but the current sensor reads zero. Furthermore, a malfunctioning current sensor can be detected if the magnitude of a current measurement may be relatively high, while voltage measurements may be steady. In response to detecting any of these failed components, the control unit may isolate the specific circuit, flag the circuit (or some internal components thereof) for maintenance, and/or continue operation if available.

In an eighth voltage example, an imminent thermal runaway can be detected in response to a hump-shape in the voltage measurements over time, such as an increase followed shortly by a decrease. In response, the control unit may disconnect the circuit, notify an operator, activate fire suppression or active cooling, and/or flag the circuit for replacement.

In a ninth voltage example, if the voltage measurements indicate that a cell fails to hold a charge and/or voltage depletion may be fast while discharging, the cell may be vented. In response, the control unit may notify an operator, disconnect or isolate the circuit, and/or flag the circuit for replacement.

In a tenth voltage example, if a fast voltage drop may be detected while charging, the control unit may detect an internal short circuit. In response, the control unit may notify an operator, disconnect or isolate the circuit, and/or flag the circuit for replacement.

In an eleventh voltage example, mis-wiring may be detected in response to a deviation among reference voltage measurements with respect to a wire chassis having a partial connection to a circuit. In response, the wiring may be flagged for maintenance, operation may continue if available, and/or the circuit or string of circuits may be isolated.

In a twelfth voltage example, a ground fault may be detected in response to a shift in voltage measurements associated with a string of circuits. The sum of voltage measurements through the circuits may be determined to verify the shift. In response, the control unit may isolate the string of circuits, continue operation, notify an operator, and/or schedule maintenance.

In an embodiment, the energy supply system that is monitored by the deviation detection system represents part of a power circuit that includes additional components (e.g., devices) electrically connected to the energy storage circuit(s) of the energy supply system. For example, the power circuit includes multiple electrical power sources, which may refer to components that can supply electrical power. The electrical power sources may include the energy storage circuits, traction motors (in a regenerative braking mode), fuel cells, alternators, generators, charge transfer contacts (for conductive charging), charge transfer coils (for inductive charging), and the like. The alternator and/or generator may be mechanically coupled to a combustion engine, such as a diesel engine. The power circuit may be disposed on a powered system. The powered system may be a vehicle, an off-board power supply system (e.g., a vehicle charging system, an inductive charging system, etc.), an electronic device, or the like. The control unit (or controller) of the deviation detection system may monitor the condition of the energy supply circuit(s), and initiate one or more remedial actions in response to detecting a deviation condition with respect to the energy supply circuit(s). The remedial action may modify the operation of one or more of the components of the power circuit.

Figure 6:
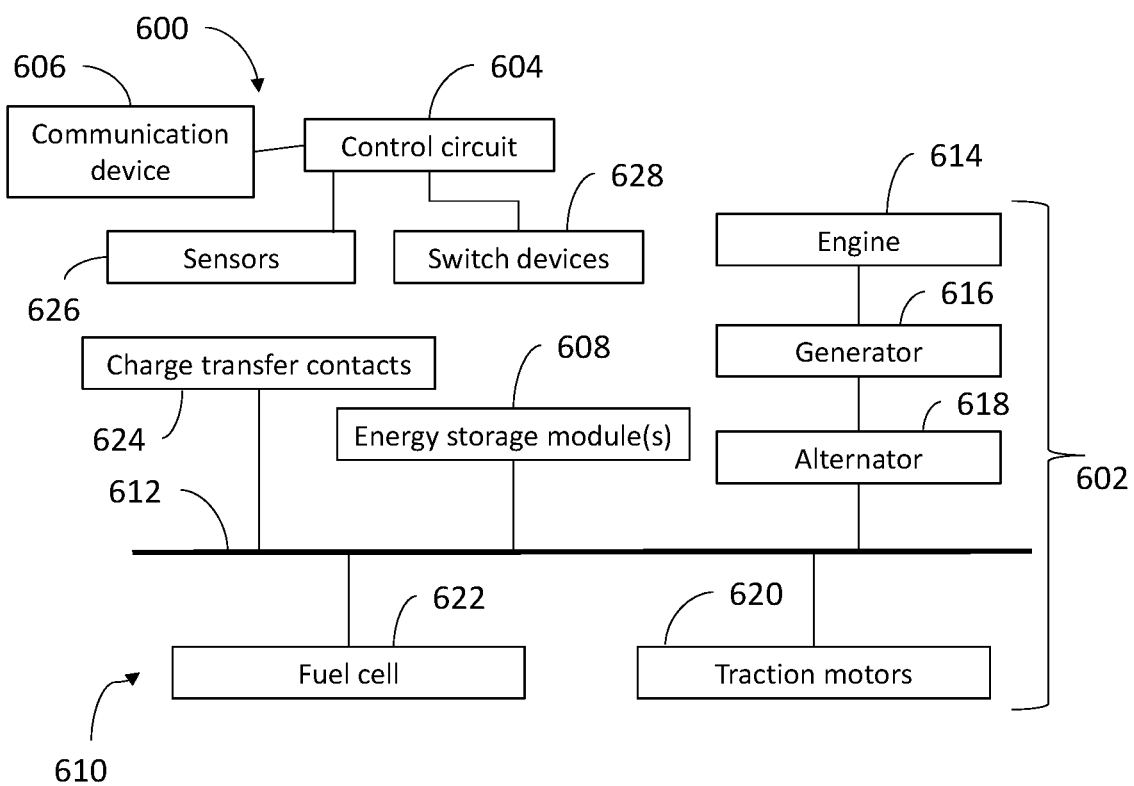
FIG. 6 is a block diagram of a deviation detection system for use with a power circuit according to an embodiment.

FIG. 6 is a block diagram of a deviation detection system 600 for use with a power circuit 602 according to an embodiment. The deviation detection system may have some of the same components as the deviation detection system in FIG. 1, such as a control unit 604, a communication device 606, and one or more energy supply circuits 608. The energy supply circuits are components of the power circuit. The energy supply circuit includes energy storage devices, such as battery cells. Optionally, the energy storage circuits may include capacitors. The power circuit includes multiple electrical power sources 610 that are electrically connected to one another to convey electrical power between the power sources and to various loads. The power sources may be connected to a conductive bus 612. In an embodiment, the power sources include the energy supply circuit(s), a generator 616 that is mechanically coupled to a combustion engine 614, an alternator 618 that is electrically connected to the generator, traction motors 620, a fuel cell 622, and charge transfer contacts 624. The power circuit may include sensors 626 for monitoring parameters of the electrical power sources. The power circuit may include switch devices 628 for controlling the transfer of electrical power through the power circuit. The control unit may be communicatively connected to the electrical power sources, the sensors, and the switch devices. The control unit may control operations of these components by generating control signals that are communicated to the components.

The power circuit may be disposed on a powered system. The charge transfer contacts may be conductive elements (e.g., metal strips or rods) that are designed to physically engage corresponding contacts of an external powered system. For example, the power circuit may be disposed onboard a vehicle, and the charge transfer contacts may be designed to physically engage a catenary, a third rail, a pantograph, or the like of an off-board power supply system. The charge transfer contacts may establish a conductive pathway that connects the vehicle to the off-board power supply system to enable power transfer from the power supply system to the vehicle for powering the vehicle. Electrical power received from the power supply system via the charge transfer contacts may be supplied to the energy supply circuit(s) for charging the energy supply circuit(s) and/or to the traction motors to power propulsion.

The power circuit may have different components in alternative embodiments. For example, the power circuit may lack one or more of the illustrated power sources, such as the fuel cell. In an alternative embodiment, the power circuit may be disposed on the off-board power supply system, and may lack traction motors. In another alterative embodiment, the power circuit may be disposed on a wireless charging device, such as a wireless charging device for electronic devices. Instead of charge transfer contacts, the wireless charging device may include a charge transfer coil for inductive power transfer with an external device or system.

The sensors are arranged and coupled to monitor parameters of all, or at least multiple power sources, in the power circuit. For example, the sensors may include voltage sensors, current sensors, and temperature sensors that monitor the parameters of the energy supply circuits, similar to the sensors shown in FIG. 1. The sensors may include additional sensors that monitor parameters of the traction motors, the engine, the generator, the alternator, the charge transfer contacts, the bus, the fuel cell, and/or the like. The control unit of the deviation detection system may analyze the sensor measurements generated by the sensors over time for detecting deviation conditions along the power circuit.

The control unit may use the switch devices to control electrical power transfer through the power circuit. For example, in response to detecting a deviation condition associated with a first energy supply circuit, the control unit may electrically isolate the first energy supply circuit from other components of the power circuit, at least temporarily, by actuating one or more of the switch devices to break conductive paths between the first energy supply circuit and other components of the power circuit, including other energy supply circuits. The switch devices may include or represent contactors, relays, solid state switches, and/or the like. Selectively isolating components that are suspected as damaged can help to reduce secondary damage to other components of the power circuit.

The control unit may tailor the responsive actions, upon detection of a deviation condition, based on a current operating mode or condition of the power circuit, an estimated source of the deviation condition (e.g., which component is at fault), and/or an estimated severity of the damage and/or risk for additional damage. In an embodiment in which the power circuit is disposed onboard a vehicle and the vehicle is currently moving along a route, one or more of the responsive actions commanded by the control unit may involve modifying or limiting the vehicle movement. For example, the control unit may generate a control signal to slow and/or stop the movement of the vehicle. The control signal may be communicated to the traction motors or to a vehicle control device for automated control, and/or to a user input/output device as instructions to an operator. For example, the control unit may control the traction motors (and optionally a steering assembly) to drive the vehicle to a maintenance facility to address the fault. If the deviation condition is estimated as relatively low severity, the control unit may impose a movement restriction that limits the speed, distance, power output (e.g., tractive effort), and/or the like of the vehicle, while enabling the vehicle to continue traveling along the route.

In an embodiment, the control unit may reallocate power supply responsibilities (e.g., assignments) among the different electrical power sources of the power circuit based on the detected deviation condition. For example, the power circuit may be in a charging mode such that the charge transfer contacts are physically connected to corresponding off-board contacts of a power supply system. If the control unit detects a deviation condition while the power circuit is in the charging mode, the control unit may limit or cease, at least temporarily, the electrical power transfer between the local and off-board contacts. If the control unit determines that the source of the deviation condition is estimated to be related to the off-board power supply system and/or the charge transfer contacts, the control unit may control the switch devices to electrically isolate the charge transfer contacts from other components of the power circuit. The control unit may make up for the lack of electrical power received from off-board by increasing the amount of electrical power supplied to the bus from the fuel cell, the traction motors in regenerative braking mode, and/or the engine, generator, and alternator set. For example, the control unit may actuator one or more switch device to direct electrical power generated by the traction motors during regenerative braking to the energy supply devices to charge the energy supply devices.

In an embodiment, the deviation detection system may monitoring operations of multiple components of the power circuit, in addition to the energy supply circuit(s), to detect deviations along the power circuit. The deviation detection system may detect parameter deviations specific to any of the individual electrical power sources. The deviations along the power circuit may represent a scenario in which a first monitored value of a first parameter at a first power source deviates from a second monitored value of the first parameter at a second power source by greater than an expected error (e.g., designated tolerance margin). For example, two power sources in series in the power circuit may be expected to receive equal electric current (e.g., RMS current). If the current received at the first power source deviates from the current received at the second power source, which is connected in series with the first power source, by greater than the designated tolerance margin, then the control unit may detect/identify a deviation condition. For example, the first power source may be a first traction motor coupled to a first axle and/or wheelset of the vehicle, and the second power source may be a second traction motor coupled to a second axle and/or wheelset of the vehicle. The sensors may monitor operating parameters of each of the traction motors during regenerative braking, such as the current generated by the traction motors, a voltage of the tractive motors, a temperature of the traction motors, and/or the like. The monitored parameters of the first traction motor may be expected to be similar to the monitored parameters of the second traction motor. The control unit may detect the deviation condition in response to a first monitored parameter of the first traction motor deviating by more than the designated tolerance margin relative to (i) the first monitored parameter of the second traction motor and/or (ii) the reference value of the parameter. The reference value of the parameter may be based on the sensor measurements of the first monitored parameter associated with each of the first and second traction motors. In an embodiment, control unit may detect a deviation condition in response to the first monitored parameter of the first traction motor having a rate of change that differs from the rate of change of the reference value (e.g., reference rate of change value) by more than the designated tolerance margin.

The reference values and/or variations for the monitored parameters of the power circuit represent expected behavior and may be determined as described herein. For example, the control unit may compile sensor measurements generated by sensors that monitor different, but similar, power sources (such as multiple traction motors), to derive the reference value and/or variation for a given parameter. In another example, various data such as real-time sensor measurements, operating conditions, historical data, and/or information about the power sources may be input into a physics-based computational model that outputs the reference value and/or variation over time for a given parameter. For example, the control unit may predict the RMS current through the alternator based on one or more monitored parameters of the engine (e.g., manifold pressure, power output, fuel consumption, noise, etc.) and/or generator (e.g., current and/or voltage).

In response to detecting a deviation condition, the control unit may identify the power source that is associated with the deviation condition. For example, the sensor measurements may be tagged with data tags (e.g., metadata) that indicate which sensor generated the measurement. The control unit may analyze the sensor measurements of the monitored parameter that deviated beyond the tolerance margin and determine, based on the data tags, which sensor generated the fault-triggering measurements. Upon determining that a first sensor generated the deviating measurements, the control unit may identify which power source is associated with that first sensor by accessing a data table or the like. The data table may provide a list of the power sources and the specific sensors that monitor each of the power sources. The data table may be stored in a memory device. After identifying the power source that is associated with the deviation condition, the control unit may perform the one or more responsive actions that are based, at least in part, on the type of the power source. For example, if the deviation condition stems from one of the traction motors and/or one of the energy supply circuits, the control unit may actuate the switch devices to isolate and deactivate that specific traction motor and/or energy supply circuit, without isolating all of the traction motors or all of the energy supply circuits.

Figure 7:
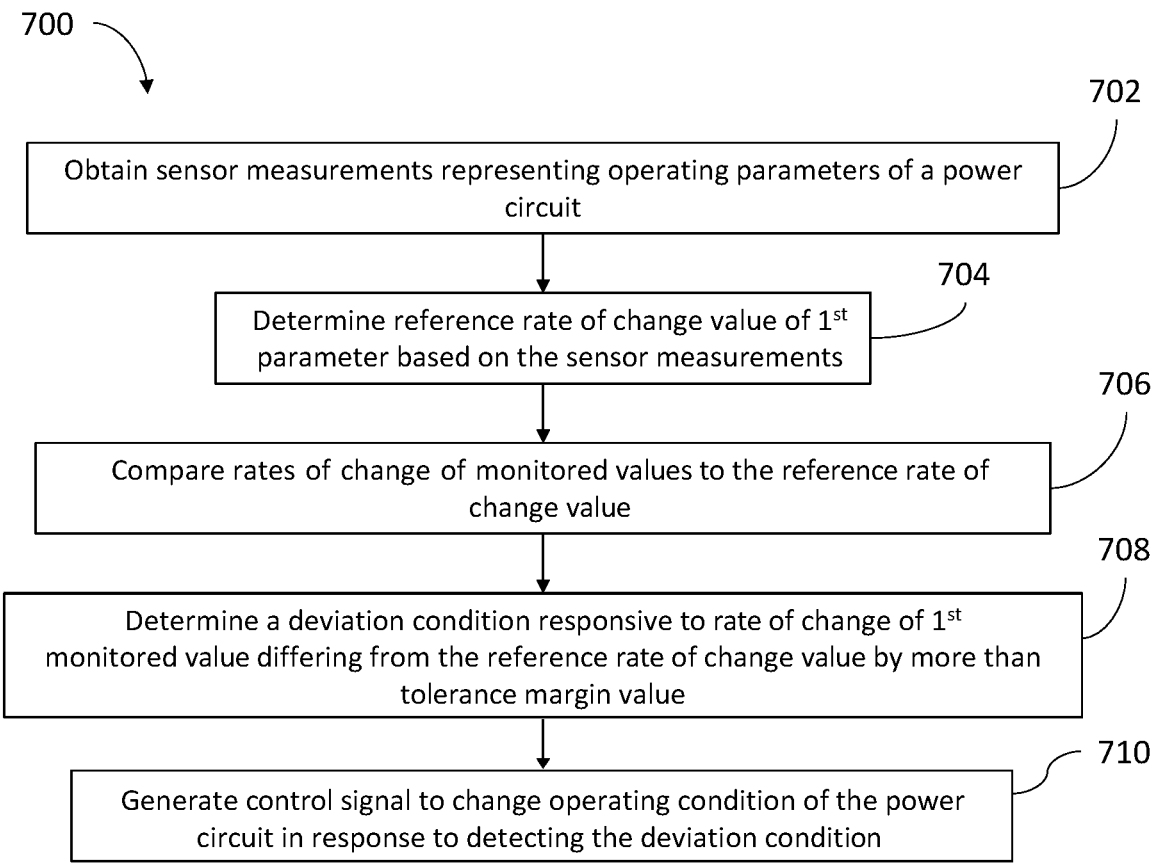
FIG. 7 is a flow chart of a method for detecting deviation conditions according to an embodiment.

FIG. 7 is a flow chart 700 of a method for detecting and responding to a deviation condition according to an embodiment. The method may be performed in whole or in part by the control unit shown in FIG. 1 and/or the control unit shown in FIG. 6. Optionally, the method may include additional steps, fewer steps, and/or different steps than the illustrated flow chart. At step 702, sensor measurements are obtained that represent operating parameters of electrical power sources of a power circuit. The sensor measurements may be generated by sensors configured to monitor the operating parameters of the electrical power sources.

At step 704, a reference value of a first parameter of the operating parameters over time is determined or obtained. The reference value is based on the sensor measurements. The reference value may be a reference rate of change value or a reference variation between monitored values of the sensor measurements. At step 706, monitored values of the first parameter over time are compared to the reference value over time. For example, the reference value may represent the expected behavior of the first parameter by one or more associated electrical power sources. Each of the monitored values may represent the actual experimental data of the first parameter as measured by the sensors. For example, one of the monitored values may represent the first parameter of a first power source as measured by a first sensor, and another monitored value may represent the first parameter of a second power source as measured by a second sensor.

At step 708, a deviation condition is detected in response to a rate of change of a first monitored value of the monitored values differing from a rate of change of the reference value (e.g., a reference rate of change value) by more than a determined (e.g., designated) tolerance margin value. The first monitored value may be associated with a first power source of the one or more electrical power sources. For example, a temperature of an energy supply device of a first energy supply circuit may have a rate of change that differs from the rate of change of the reference value by more than the determined tolerance margin value.

At step 710, a control signal is generated to change an operating condition of at least one of the first power source or the power circuit in response to detecting the deviation condition. The change in the operating condition may be to switch from a first operating mode to a second operating mode. The operating condition may be changed by initiating a first remedial action. The first remedial action may include blocking or limiting electrical power transfer between the power circuit and an external powered system, blocking electrical power transfer between the first power source and other components of the power circuit, adjusting an ambient temperature surrounding the power circuit and/or the first power source, adjusting a temperature conditioning rate around the power circuit and/or the first power source, inducing a designated load on the power circuit, initiating active cooling, or initiating fire suppression. In an embodiment, the first remedial action may be to electrically isolate the first power source and reallocate power among other power sources of the power circuit based on the removal of the first power source.

Optionally, the method may include identifying a first sensor of the sensors that generated sensor measurements on which the first monitored value (which deviated from the reference value) is based. The first sensor may be identified based on self-identifying data tags in the sensor measurements generated by the first sensor. The method may include estimating a cause of the deviation condition based at least in part on the sensor measurements generated by the first sensor. For example, the cause of the deviation condition may be estimated at least in part by comparing the sensor measurements generated by the first sensor prior to changing the operating condition to sensor measurements generated by the first sensor after changing the operating condition. Optionally, after estimating the cause of the deviation condition, the method may include modifying the first remedial action based on the cause that is determined. For example, if it is determined that the cause of the deviation condition is a faulty sensor and that the first power source itself is functioning properly, then the remedial action may be modified by reestablishing the electrical connection of the first power source to the other power sources of the power circuit. For example, the first power source may be permitted to continue operation. The modified remedial action may include removing operating restrictions from the first power source, flagging the faulty sensor for replacement, notifying an operator, scheduling maintenance, and/or the like.

In an embodiment, the reference value or variation may be based on, or represented by, an adaptive model that characterizes a relationship between at least two operating parameters of the power circuit. The adaptive model may be based on the sensor measurements (e.g., sensor data) that monitor the power circuit and components thereof. The control unit may generate the adaptive model over time, using a change detection algorithm, to monitor error or offset between the values of one of the operating parameters that is monitored and an output function of the adaptive model. The control unit may use the adaptive model to detect the deviation condition (e.g., shift incident), which occurs when the offset indicates a significant, relatively sudden change in the relationship between the at least two operating parameters in the adaptive model.

To generate the adaptive model, the control unit may obtain values of at least two operating parameters of the power supply system over time. The values of the at least two operating parameters may be based on the sensor data generated by the sensors. For example, one or more of the operating parameters may be directly measured by sensors. One or more other operating parameters may be indirectly derived based on other operating parameters that are directly measured. For example, a derived operating parameter may be calculated by inputting the values of one or more directly-measured parameters into a modeled function. In one embodiment, the control unit may generate the adaptive model based on a first operating parameter and a second operating parameter only, but other embodiments may use more than two operating parameters to generate the adaptive model. The control unit may obtain the values of the first and second operating parameters through messages received by the communication device, by accessing values that are pre-stored in the memory, or the like.

Various operating parameters may be selected as the basis of the adaptive model. The specific operating parameters that are used to generate the adaptive model may be selected based on a correlation between behavior of the operating parameters as the power circuit operates. For example, the first operating parameter and the second operating parameter may generally fluctuate together in response to changes in the operation of the power circuit. For example, a change in the first parameter may be accompanied by a change in the second parameter. The changes in the parameters may be generally repeatable and consistent during normal operating conditions. The adaptive model may be generated to learn and characterize the relationship between the first and second parameters. The control unit detect the deviation condition (or shift incident) when the learned relationship between the operating parameters significantly changes.

In an example, the first operating parameter used to generate the adaptive model is a flow rate of exhaust gas (referred to herein as exhaust flow) emitted from an engine, and the second operating parameter used to generate the adaptive model is pressure within the crankcase (referred to as crankcase pressure) of the engine. During engine operations at steady state conditions, a change in exhaust flow may be generally accompanied by a change in crankcase pressure. In an embodiment, the crankcase pressure may be directly measured via a pressure sensor, and the exhaust flow is derived from other parameters, such as engine speed, manifold pressure, temperature, and the like. For example, the exhaust flow may be estimated based on the conservation of mass by determining fresh air supplied to the engine and combusted fuel, which combine to form the exhaust. Alternatively, the exhaust flow may be measured directly via one or more sensors. The exhaust flow may be proportional to tractive settings (e.g., notch settings) of the engine, such that the flow rate of exhaust increases with higher notch settings.

Different operating parameters may be used to generate the adaptive model in other embodiments. For example, when the power circuit includes a fuel cell, the first operating parameter may be fuel flow, and the second operating parameter may be pressure drop across a fuel filter of the fuel cell. In another fuel cell example, the first operating parameter may be energy efficiency, and the second parameter may be power. In an example in which the power circuit includes a battery pack, the first operating parameter may be electric current, and the second parameter may be power loss experienced during charging and/or discharging of the battery pack.

The control unit may generate the adaptive model based on values of the first and second operating parameters monitored during a common time period as the power circuit operates. The following description refers to an adaptive model based on crankcase pressure and exhaust flow, but the adaptive model can be based on different operating parameters in other embodiments. The control unit may arrange the values of the crankcase pressure and exhaust flow into data points based on time. For example, each data point may be defined by a respective exhaust flow value and a respective crankcase pressure value, which correspond to approximately the same instant in time (e.g., within 1 second, 0.5 seconds, 0.1 seconds, or the like of each other). If plotted on a graph, the exhaust flow value would represent a first coordinate (e.g., along X axis) and the crankcase pressure value would represent a second coordinate (e.g., along Y axis). During a period of time that the power circuit is monitored, hundreds or thousands of data points may be collected and used to generate the adaptive model. The control unit may continuously update the adaptive model based on new, updated data points received over time. For example, the control unit may initially generate the adaptive model during the time period that the power supply system is monitored, and may update the adaptive module over time as additional values of the operating parameters are obtained (and new data points produced.

The data points have different coordinates (e.g., $(x_1, y_1)$, $(x_2, y_2)$, $(x_n, y_n)$). For example, the data point that has coordinates $(x_1, y_1)$ represents the value of exhaust flow $(x_1)$ and the value of crankcase pressure $(y_1)$ at a first time during the monitored time period. The data point $(x_2, y_2)$ represents the value of exhaust flow $(x_2)$ and the value of crankcase pressure $(y_2)$ at a second time during the monitored time period. The sample data points may be generated periodically, such as every tenth of a second, every 0.2 seconds, every 0.5 seconds, or the like.

The control unit may group the data points into bins according to designated ranges of the first operating parameter. In an example, the bins are defined by ranges of the exhaust flow. The bins may have fixed, non-overlapping ranges. For example, a first bin may represent a range of 1 to 1000 grams per second (g/sec), a second bin may represent the range of 1001 to 1500 g/sec, a third bin may be 1501 to 2000 g/sec, and a fourth bin may be 2001 to 2500 g/sec. The ranges may be selected based on tractive settings of the engine. For example, the range of the first bin may be selected to contain exhaust flow values when the engine operates at a first notch setting, the range of the second bin may be selected to contain exhaust flow values when the engine operates at a second notch setting, and the like. The ranges of the bins may be uniform, or alternatively may vary in size, such that one bin has a greater or narrower range than another bin.

The control unit my calculate nodes associated with individual bins based on the data points within the individual bins. For example, a first node may be calculated based on the data points in the first bin only (e.g., without factoring data points in other bins). A second node may be calculated based on the data point in the second bin only. Third and fourth nodes may be calculated in a similar manner for the third and fourth bins, respectively. Each node may be located at the center of the data points within the associated bin. The control unit may determine each of the nodes by calculating a first mean of the values of the first operating parameter of the data points within the associated bin. The control unit may calculate a second mean of the values of the second operating parameter of the data points within the associated bin. In the current example, the first mean is the mean of the exhaust flow values of the data points in the respective bin, and the second mean is the mean of the crankcase pressure values of the data points in the respective bin. The control unit may classify the first mean and the second mean as coordinates of the node. For example, the X coordinate of the node in the first bin is the mean of the exhaust flow values in the first bin, and the Y coordinate of the node is the mean of the crankcase pressure values in the first bin.

In an embodiment, the first mean and the second mean may be weighted means. The control unit may weight the first mean and the second mean by incorporating a forgetting factor into the calculation of the first and second means. The forgetting factor may apply greater weight to the data points that are more recent (e.g., newer) and less weight to the data points that are less recent (e.g., older). The forgetting factor may be greater than 0 and less than 1. The forgetting factor may be exponentially weighted to forget the past. As a result, the newer data points are weighted more heavily than the older data points, so the newer data points have a greater effect on the location of the node than the older data points. As updated data points are received, the control unit may update the location of the node based on the updated data. The node may represent a moving average of data samples within the bounded bin, with exponential forgetting of old data samples. In an alternative embodiment, the control unit may not incorporate the forgetting factor into the node calculation, such that the location of the node is equally influenced by each of the data points in the bin.

The control unit may postpone calculating the node in a given bin until there is at least a threshold number of data points within that bin. This constraint ensures that a sufficient amount of data is collected before the data is factored into the generation of the adaptive table. The threshold number of data points may be 20, 50, 100, or the like. When there are a sufficient number of data samples in the bin, averaging the exhaust flow values and the crankcase pressure values to calculate the nodes may constructively act as a discrete low pass filter.

After calculating the nodes, the control unit may determine an output function based on the nodes. The output function represents the relationship between the first and second operating parameters, which are exhaust flow and crankcase pressure in the illustrated example. For example, the output function may characterize the relationship into a mathematical function. In an embodiment, the control unit may determine the output function of the adaptive model by performing a linear interpolation (e.g., linear fit) that connects the nodes. The output function may be a linear, first-order interpolation (or fit) that connects the nodes. The output function may be graphed and/or incorporated into a look-up table, or the like. The first node in the graph may be at the origin point (0,0). The last (e.g., highest exhaust flow) node in the graph may be a high end point that is extrapolated based on the output function and the node in the last bin. The nodes between the first and last nodes represent nodes of valid bins. Valid bins are bins that meet applicable constraints, such as having at least the threshold number of data points. The output function may not be linear from the first node to the last node. Furthermore, the output function may change (e.g., adapt) over time as the nodes move based on updated data. The output function may represent the expected behavior of the power circuit (e.g., engine) based on the monitored parameters.

The control unit may apply a margin to surround the output function of the adaptive model. The margin may extend above the output function to an upper limit or boundary and below the output function to a lower limit or boundary. The size of the margin, including the upper and lower boundaries, may be designated (e.g., pre-calibrated). For example, the upper and lower boundaries may be stored in the memory of the control unit. The control unit may use the margin surrounding the output function to detect a deviation condition (or shift incident) according to the change detection algorithm stored in the memory.

The control unit may implement the change detection algorithm to detect a mean shift in the data above and/or below the calibrated margin, which surrounds the output function of the adaptive model. In an embodiment, the control unit may determine an offset (e.g., residual offset or error) between the output function of the adaptive model and recent values of the second operating parameter. In an example, the second operating parameter is crankcase pressure. The control unit may detect the deviation condition (or shift incident) by inputting the offset into the change detection algorithm. The change detection algorithm may detect a mean shift in the data points that are outside of the designated margin. For example, the change detection algorithm may integrate those data points that are outside of the designated margin (without integrating the data points within the margin).

Residual offset can be plotted over time, and represents the difference between the difference or error between the actual, measured values of the crankcase pressure and the expected values of the crankcase pressure characterized in the output function of the adaptive model. The residual offset (herein referred to as offset) may be input to the change detection algorithm. In an embodiment, the change detection algorithm may be a cumulative sum control (CUSUM) algorithm, implemented by the control unit. The CUSUM algorithm may detect shifts based on a cumulative sum of the offsets. The CUSUM algorithm may integrate the values of the crankcase pressure in the data that exceed the upper limit or boundary of the margin. The values in excess of the upper limit may be determined by subtracting a tolerance from the offsets, where the tolerance represents the distance from the output function of the adaptive model to the upper limit. The CUSUM algorithm may integrate the amounts by which the crankcase pressure values exceed the upper limit to determine if a mean shift has occurred. If a mean shift occurs, the output signal of the CUSUM algorithm experiences a stark increase. Another CUSUM algorithm may be applied to integrate the values of the crankcase pressure in the data that are below the lower limit or boundary of the margin.

The control unit, implementing the CUSUM algorithm, may detect a mean shift in the values of the crankcase pressure by at least one standard deviation relative to the output function of the adaptive model. Optionally, the CUSUM algorithm may be designed to detect mean shifts of at least 1.5 standard deviations. By integrating, the CUSUM algorithm may successfully ignore noise and random outlier data points, as only a significant shift in the average of the data causes the output signal to run. In an embodiment, the control unit may detect the deviation condition (or shift incident) when the output signal of the change detection algorithm (e.g., the CUSUM algorithm) exceeds a threshold value. In an embodiment, the adaptive model may be a closed loop, and the residual offset may always approach 0 over time. As such, the output signal of the change detection algorithm may return to 0. The control unit may monitor for quick shifts that exceed the threshold. Optionally, the control unit may have multiple threshold values, and the control unit may take different responsive actions based on which thresholds are surpassed by the output signal of the change detection algorithm. Although CUSUM is described, various other types of change detection algorithms may be used to detect the mean shift in the data relative to the adaptive model.

The deviation condition (or shift incident) may be an indication that the engine or other component of the power circuit is damaged. One of the benefits of the deviation detection system disclosed herein is that deviation conditions may be detected on the order of seconds after the incident occurred, which enables prompt responses to reduce the risk of secondary damage. In response to detecting a deviation condition, the control unit may take one or more actions, as described herein.

A technical effect of one or more embodiments of the deviation detection system and method described herein may include early detection of malfunctioning and failed components, which enables early remedial actions to prevent and/or reduce damage caused by the malfunctions and failures. For example, early detection of fire and/or thermal runaway in an energy supply device may allow for early actions to prohibit the spread of fire and thermal runaway to other energy supply devices, thereby reducing danger and conserving and extending the life of the functioning energy supply devices. Another technical effect of the deviation detection system and method may include the ability to provide automated, cause-specific responses to detected anomalies. For example, by estimating a cause of the anomalies based on an analysis of sensor measurements, the control unit may initiate actions that may be specifically tailored to the estimated cause, which increases efficiencies and provides better support to the energy supply system than known monitoring systems that provide the same responsive actions for every detected deviation. For example, if the control unit estimates that the cause of the deviation may be trivial, such as a broken sensor, then the control unit may allow the energy supply system to continue operations, thereby providing beneficial work output, rather than automatically shutting the energy system down to address the worst-case scenario of fire and/or thermal runaway.

In an embodiment, a system includes a first group of sensors and a control unit including one or more processors. The first group of sensors is associated with an energy supply circuit that includes one or more energy supply devices. The sensors in the first group may generate sensor measurements representing one or more parameters of the energy supply circuit. The control unit may receive the sensor measurements generated by the sensors and determine a reference value and/or a reference variation of a specific parameter related to the energy supply circuit based at least in part on the sensor measurements. The control unit may compare monitored values and/or monitored variations of the specific parameter, based on the sensor measurements generated by sensors of the first group, to the reference value and/or the reference variation of the specific parameter and detect a deviation that is greater than a designated tolerance margin.

Optionally, the control unit may determine the reference value and/or reference variation of the specific parameter based on the sensor measurements generated by the first group of sensors associated with the energy supply circuit and one or more of: (i) sensor measurements generated by a second group of sensors associated with a different, second energy supply circuit, (ii) inherent characteristics of the energy supply circuit, (iii) operating conditions of the energy supply circuit, or (iv) historical information about the energy supply circuit or about other energy supply circuits. Optionally, responsive to detecting the deviation that is greater than the designated tolerance margin, the control unit may identify a particular sensor in the first group that generated sensor measurements on which one or more of the deviating monitored values and/or monitored variations are based. The control unit may estimate a cause of the deviation by comparing the sensor measurements generated by the particular sensor to sensor measurements generated by other sensors in the first group or generated by other sensors in a second group associated with a different, second energy supply circuit.

Optionally, responsive to detecting the deviation that is greater than the designated tolerance margin, the control unit may generate a control signal configured to change one or more of the operating conditions of the energy supply circuit. Optionally, the control signal may change one or more of the operating conditions of the energy supply circuit by one or more of: (i) blocking electric current transfer of the energy supply circuit, (ii) adjusting a non-zero rate of electric current transfer of the energy supply circuit, (iii) adjusting an ambient temperature surrounding the energy supply circuit, (iv) adjusting a temperature conditioning rate around the energy supply circuit, (v) inducing a designated load on the energy supply circuit, (vi) initiating active cooling, (vii) initiating fire suppression, or (viii) flagging the energy supply circuit for repair. Optionally, the control unit may identify a particular sensor in the first group that generated sensor measurements on which one or more of the deviating monitored values and/or monitored variations are based. The control unit may monitor additional sensor measurements generated by the particular sensor during a determined period of time after changing one or more of the operating conditions of the energy supply circuit. The control unit may estimate a cause of the deviation based at least in part on the additional sensor measurements generated by the particular sensor during the determined period of time.

Optionally, the control unit may detect the deviation that is greater than the designated tolerance margin independent of any of the sensor measurements exceeding a preset threshold value. Optionally, the one or more energy storage devices of the energy supply circuit are batteries. The energy storage circuit represents one or more of a single battery cell, an assembly of multiple battery cells connected to one another in series, or an assembly of multiple battery cells connected to one another in parallel. Optionally, the specific parameter is one of temperature, voltage, current, power, state of charge, charge capacity, pressure, coolant flow rate, or resistance. Optionally, the control unit may determine the reference value and/or the reference variation of the specific parameter based on a physics-based model that incorporates inherent characteristics of the energy storage circuit, operating conditions of the energy storage circuit, and historical information about the energy storage circuit. Optionally, the control unit may determine the reference value and/or the reference variation of the specific parameter at least in part by compiling the sensor measurements that are generated by the sensors in the first group. Optionally, the control unit and the first group of sensors are disposed onboard a vehicle that is propelled at least in part by the energy supply circuit.

In an embodiment, a method includes obtaining sensor measurements generated by a first group of sensors associated with an energy supply circuit. The energy supply circuit may include one or more energy storage devices. The sensor measurements represent one or more parameters of the energy supply circuit. The method includes comparing monitored values and/or monitored variations of a specific parameter related to the energy supply circuit to a reference value and/or a reference variation of the specific parameter. Both the monitored values and/or monitored variations and the reference value and/or reference variation are based at least in part on the sensor measurements generated by the first group of sensors. The method includes detecting a deviation condition responsive to one or more of the monitored values and/or monitored variations deviating from the reference value and/or reference variation by more than a designated tolerance margin. The method includes identifying a first sensor of the first group that generated sensor measurements on which one or more of the deviating monitored values and/or monitored variations are based, and estimating a cause of the deviation condition based at least in part on the sensor measurements generated by the first sensor.

Optionally, responsive to detecting the deviation condition, the method includes generating a control signal to change one or more operating conditions of the energy supply circuit. Optionally, the cause of the deviation condition is estimated at least in part by comparing the sensor measurements generated by the first sensor prior to changing the one or more operating parameters of the energy storage circuit to sensor measurements generated by the first sensor after changing the one or more operating parameters. Optionally, the control signal may change the one or more operating conditions by one or more of: (i) adjusting an ambient temperature surrounding the energy storage circuit, (ii) adjusting a temperature conditioning rate around the energy storage circuit, (iii) inducing a designated load on the energy storage circuit, (iv) substituting the first sensor, (v) blocking electric current transfer operation of the energy storage circuit, (vi) adjusting a non-zero rate of electric current transfer of the energy storage circuit, (vii) initiating active cooling, (viii) initiating fire suppression, or (ix) flagging the energy storage circuit for repair or replacement.

Optionally, the method includes determining the reference value and/or the reference variation of the specific parameter based on the sensor measurements generated by the first group of sensors associated with the energy supply circuit and one or more of: (i) sensor measurements generated by a second group of sensors associated with a different, second energy supply circuit, (ii) inherent characteristics of the energy supply circuit, (iii) operating conditions of the energy supply circuit, or (iv) historical information about the energy supply circuit or about other energy supply circuits. Optionally, the cause of the deviation condition is estimated by comparing the sensor measurements generated by the first sensor to one or more of: (i) sensor measurements generated by other sensors in the first group or (ii) sensor measurements generated by a second group of sensors associated with a different, second energy supply circuit. Optionally, the specific parameter is one of temperature, voltage, current, power, state of charge, charge capacity, pressure, coolant flow rate, or resistance.

Optionally, the control unit may obtain the reference value of the first parameter by generating an adaptive model based on values of the first parameter of the operating parameters over time and values of a second parameter of the operating parameters over time. The adaptive model may include a plurality of data points with each of the data points defined by a respective value of the first operating parameter and a respective value of the second operating parameter. The control unit may group the data points into bins according to designated ranges of the first operating parameter and calculate nodes associated with individual bins based on the data points within the individual bins. The control unit may determine an output function based on the nodes which represents a relationship between the first and second operating parameters. The control unit may determine the deviation condition based at least in part on an offset between the output function of the adaptive model and the values of the second operating parameter over time.

In an embodiment, a system includes a control unit with one or more processors. The control unit may obtain sensor measurements generated by a first group of sensors associated with an energy supply circuit that includes one or more energy supply devices. The sensor measurements represent one or more parameters of the energy supply circuit. The control unit may compare the sensor measurements that represent a specific parameter of the one or more parameters to a reference value of the specific parameter and/or a reference variation of the specific parameter. In response to detecting that one or more of the sensor measurements deviates from the reference value and/or reference variation by more than a designated tolerance margin, the control unit may identify a first sensor of the first group that generated at least some of the one or more deviating sensor measurements, estimate a cause of the deviation based at least in part on the sensor measurements generated by the first sensor, and generate a control signal to initiate one or more remedial actions based on the suspected or estimated cause.

In an embodiment, a system includes one or more sensors configured to monitor one or more operating parameters of components of a power circuit and to generate sensor measurements representing a first parameter of the one or more operating parameters. The system includes a control unit configured to obtain a reference value of the first parameter based at least in part on the sensor measurements over time. The reference value is a rate of change value. The control unit is configured to compare rates of change of monitored values of the sensor measurements over time to the rate of change of the reference value over time, and determine a deviation condition in response to the rate of change of a first monitored value of the sensor measurements differing from the rate of change of the reference value by more than a determined tolerance margin value. The control unit configured to generate a control signal responsive to detecting the deviation condition to change an operating condition of at least one of the components of the power circuit.

The first parameter may be one of temperature, voltage, current, power, state of charge, charge capacity, pressure, flow rate, or resistance. Optionally, the components of the power circuit may include one or more electrical power sources that include one or more of an energy supply circuit, a traction motor in a regenerative braking mode, a fuel cell, an alternator, a generator mechanically coupled to the engine, charge transfer contacts for conductive power transfer, or a charge transfer coil for inductive power transfer. Optionally, the power circuit may be a charging system for an electric vehicle. The control unit may change the operating condition by imposing a movement restriction on the electric vehicle that limits at least one of speed of the electric vehicle, distance traveled of the electric vehicle, load placed on energy storage devices of the power circuit, or a power output of the electric vehicle. Optionally, the control unit may change the operating condition by initiating a first remedial action in response to detecting the deviation condition. The control unit may estimate a cause of the deviation condition and modify the first remedial action based on the cause that is estimated.

Optionally, the power circuit may transfer electrical power with an external powered system. The control unit may change the operating condition by imposing a restriction that one of limits or blocks electrical power transfer with the external powered system. Optionally, the components of the power circuit may include electrical power sources, and the control unit may generate the control signal to electrically isolate a first power source of the electrical power sources from the other electrical power sources of the power circuit. Optionally, the control unit may analyze data tags of sensor measurements on which the first monitored value is based, and may identify at least a first sensor of the sensors as a source of deviating sensor measurements based on the data tags.

In an embodiment, a method may include obtaining sensor measurements representative of one or more operating parameters of a power circuit, and determining a reference rate of change value of a first parameter of the one or more operating parameters over time based at least in part on the sensor measurements. The method may include comparing rates of change of monitored values of the sensor measurements over time to the reference rate of change value, and determining a deviation condition in response to the rate of change of a first monitored value of the sensor measurements differing from the reference rate of change value by more than a determined tolerance margin value. The method may include generating a control signal to change an operating condition of the power circuit in response to detecting the deviation condition.

Optionally, the method may include identifying a first sensor of the sensors that generated sensor measurements on which the first monitored value is based, and estimating a cause of the deviation condition. The cause may be estimated by comparing the sensor measurements generated by the first sensor prior to changing the operating condition to sensor measurements generated by the first sensor after changing the operating condition. Optionally, generating the control signal to change the operating condition may include initiating a first remedial action in response to detecting the deviation condition. The method may include estimating a cause of the deviation condition, and modifying the first remedial action based on the cause that is estimated.

In an embodiment, a system may include one or more sensors that monitor one or more operating parameters of one or more electrical power sources of a power circuit and generate sensor measurements representing at least one of the operating parameters. The system may include a control unit including one or more processors. The control unit may determine a reference variation of a first parameter of the operating parameters over time based on the sensor measurements. The control unit may compare monitored variations between monitored values of the first parameter over time to the reference variation over time, and determine a deviation condition in response to the monitored variation between a first monitored value of the first parameter and a second monitored value of the first parameter exceeding the reference variation by more than a designated tolerance margin value. The control unit may generate a control signal responsive to detecting the deviation condition to change an operating condition of at least one of the one or more electrical power sources of the power circuit.

Optionally, the one or more electrical power sources of the power circuit may include one or more of an energy supply circuit, a traction motor in a regenerative braking mode, a fuel cell, an alternator, a generator mechanically coupled to the engine, charge transfer contacts for conductive power transfer, or a charge transfer coil for inductive power transfer. Optionally, the first and second monitored values may be based at least in part on the sensor measurements generated by two different sensors that monitor two different electrical power sources of a common type. Optionally, at least one of the first monitored value or the second monitored value may be associated with a first power source of the one or more electrical power sources. The control unit may generate the control signal to electrically isolate the first power source from the other electrical power sources of the power circuit.

Optionally, the control unit may change the operating condition by one or more of blocking electrical power transfer between the power circuit and an external powered system, limiting a non-zero electrical power transfer between the power circuit and the external powered system, adjusting an ambient temperature surrounding the power circuit, adjusting a temperature conditioning rate around the power circuit, inducing a designated load on the power circuit, initiating active cooling, or initiating fire suppression. Optionally, the control unit may change the operating condition by initiating a first remedial action in response to detecting the deviation condition. The control unit may estimate a cause of the deviation condition and modify the first remedial action based on the cause that is estimated. Optionally, the power circuit may be a charging system for an electric vehicle. The control unit may change the operating condition by imposing a movement restriction on the electric vehicle that limits at least one of speed of the electric vehicle, distance traveled of the electric vehicle, an electric load on the power circuit, or a power output of the electric vehicle.

In one embodiment, the control units (controllers) or systems described herein may have a local data collection system deployed and may use machine learning to enable derivation-based learning outcomes. The control units may learn from and make decisions on a set of data (including data provided by the various sensors), by making data-driven predictions and adapting according to the set of data. In embodiments, machine learning may involve performing a plurality of machine learning tasks by machine learning systems, such as supervised learning, unsupervised learning, and reinforcement learning. Supervised learning may include presenting a set of example inputs and desired outputs to the machine learning systems. Unsupervised learning may include the learning algorithm structuring its input by methods such as pattern detection and/or feature learning. Reinforcement learning may include the machine learning systems performing in a dynamic environment and then providing feedback about correct and incorrect decisions. In examples, machine learning may include a plurality of other tasks based on an output of the machine learning system. In examples, the tasks may be machine learning problems such as classification, regression, clustering, density estimation, dimensionality reduction, anomaly detection, and the like. In examples, machine learning may include a plurality of mathematical and statistical techniques. In examples, the many types of machine learning algorithms may include decision tree based learning, association rule learning, deep learning, artificial neural networks, genetic learning algorithms, inductive logic programming, support vector machines (SVMs), Bayesian network, reinforcement learning, representation learning, rule-based machine learning, sparse dictionary learning, similarity and metric learning, learning classifier systems (LCS), logistic regression, random forest, K-Means, gradient boost, K-nearest neighbors (KNN), a priori algorithms, and the like. In embodiments, certain machine learning algorithms may be used (e.g., for solving both constrained and unconstrained optimization problems that may be based on natural selection). In an example, the algorithm may be used to address problems of mixed integer programming, where some components restricted to being integer-valued. Algorithms and machine learning techniques and systems may be used in computational intelligence systems, computer vision, Natural Language Processing (NLP), recommender systems, reinforcement learning, building graphical models, and the like. In an example, machine learning may be used making determinations, calculations, comparisons and behavior analytics, and the like.

In one embodiment, the control units may include a policy engine that may apply one or more policies. These policies may be based at least in part on characteristics of a given item of equipment or environment. With respect to control policies, a neural network can receive input of a number of environmental and task-related parameters. These parameters may include, for example, operational input regarding operating equipment, data from various sensors, location and/or position data, and the like. The neural network can be trained to generate an output based on these inputs, with the output representing an action or sequence of actions that the equipment or system should take to accomplish the goal of the operation. During operation of one embodiment, a determination can occur by processing the inputs through the parameters of the neural network to generate a value at the output node designating that action as the desired action. This action may translate into a signal that causes the vehicle and/or the energy supply circuit to operate. This may be accomplished via back-propagation, feed forward processes, closed loop feedback, or open loop feedback. Alternatively, rather than using backpropagation, the machine learning system of the control unit may use evolution strategies techniques to tune various parameters of the artificial neural network. The control unit may use neural network architectures with functions that may not always be solvable using backpropagation, for example functions that are non-convex. In one embodiment, the neural network has a set of parameters representing weights of its node connections. A number of copies of this network are generated and then different adjustments to the parameters are made, and simulations are done. Once the output from the various models are obtained, they may be evaluated on their performance using a determined success metric. The best model is selected, and the vehicle controller executes that plan to achieve the desired input data to mirror the predicted best outcome scenario. Additionally, the success metric may be a combination of the optimized outcomes, which may be weighed relative to each other.

The foregoing description of certain embodiments of the inventive subject matter will be understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

The above description is illustrative and not restrictive. For example, the above-described embodiments (and/or aspects thereof) may be used in combination with each other. In addition, many modifications may be made to adapt a particular situation or material to the teachings of the inventive subject matter without departing from its scope. Embodiments will be apparent to one of ordinary skill in the art upon reviewing the above description. The scope of the inventive subject matter should, therefore, be determined with reference to the appended claims, along with the full scope of equivalents to which such claims are entitled.

This written description uses examples to disclose several embodiments of the inventive subject matter and also to enable one of ordinary skill in the art to practice the embodiments of inventive subject matter, including making and using any devices or systems and performing any incorporated methods. The patentable scope of the inventive subject matter is defined by the claims, and may include other examples that occur to one of ordinary skill in the art. Such other examples are within the scope of the claims if they have structural elements that do not differ from the literal language of the claims, or if they include equivalent structural elements with insubstantial differences from the literal languages of the claims.

What is claimed is:

1. A system comprising:
one or more sensors configured to monitor one or more operating parameters of components of a power circuit and to generate sensor measurements representing a first parameter of the one or more operating parameters; and
a control unit including one or more processors, the control unit configured to:
obtain a reference value of the first parameter based at least in part on the sensor measurements over time, wherein
the reference value of the first parameter is a rate of change value, and
the reference value of the first parameter is generated by an adaptive model generated by the control unit over time that is based on values of the first parameter of the operating parameters over time and values of a second parameter of the operating parameters over time by learning and characterizing a relationship between the first parameter and the second parameter;
compare rates of change of monitored values of the sensor measurements over time to the rate of change of the reference value over time;
determine a deviation condition in response to the rate of change of a first monitored value of the sensor measurements differing from the rate of change of the reference value by more than a determined tolerance margin value; and
generate a control signal responsive to detecting the deviation condition to change an operating condition of at least one of the components of the power circuit.

2. The system of claim 1, wherein the components of the power circuit include one or more electrical power sources, the one or more electrical power sources including one or more of an energy supply circuit, a traction motor in a regenerative braking mode, a fuel cell, an alternator, a generator mechanically coupled to the engine, charge transfer contacts for conductive power transfer, or a charge transfer coil for inductive power transfer.

3. The system of claim 1, wherein the power circuit is a charging system for an electric vehicle.

4. The system of claim 3, wherein the control unit is configured to change the operating condition by imposing a movement restriction on the electric vehicle that limits at least one of speed of the electric vehicle, distance traveled of the electric vehicle, load placed on energy storage devices of the power circuit, or a power output of the electric vehicle.

5. The system of claim 1, wherein the power circuit is configured to transfer electrical power with an external powered system, and the control unit is configured to change the operating condition by imposing a restriction that one of limits or blocks electrical power transfer with the external powered system.

6. The system of claim 1, wherein the components of the power circuit include electrical power sources, and the control unit is configured to generate the control signal to electrically isolate a first power source of the electrical power sources from the other electrical power sources of the power circuit.

7. The system of claim 1, wherein the control unit is configured to analyze data tags of sensor measurements on which the first monitored value is based, and to identify at least a first sensor of the sensors as a source of deviating sensor measurements based on the data tags.

8. The system of claim 1, wherein the control unit is configured to change the operating condition by initiating a first remedial action in response to detecting the deviation condition, the control unit configured to estimate a cause of the deviation condition and modify the first remedial action based on the cause that is estimated.

9. The system of claim 1, wherein the first parameter is one of temperature, voltage, current, power, state of charge, charge capacity, pressure, flow rate, or resistance.

10. The system of claim 1, wherein the adaptive model comprising a plurality of data points with each of the data points defined by a respective value of the first operating parameter and a respective value of the second operating parameter, the control unit configured to group the data points into bins according to designated ranges of the first operating parameter and calculate nodes associated with individual bins based on the data points within the individual bins, the control unit configured to determine an output function based on the nodes which represents a relationship between the first and second operating parameters, the control unit configured to determine the deviation condition based at least in part on an offset between the output function of the adaptive model and the values of the second operating parameter over time.

11. A system comprising:
one or more sensors configured to monitor one or more operating parameters of one or more electrical power sources of a power circuit and to generate sensor measurements representing at least one of the operating parameters; and
a control unit including one or more processors, the control unit configured to:
determine a reference variation of a first parameter of the operating parameters over time based on the sensor measurements, wherein the reference variation of the first parameter is generated by an adaptive model generated by the control unit over time that is based on values of the first parameter of the operating parameters over time and values of a second parameter of the operating parameters over time by learning and characterizing a relationship between the first parameter and the second parameter;
compare monitored variations between monitored values of the first parameter over time to the reference variation over time;
determine a deviation condition in response to the monitored variation between a first monitored value of the first parameter and a second monitored value of the first parameter exceeding the reference variation by more than a designated tolerance margin value; and
generate a control signal responsive to detecting the deviation condition to change an operating condition of at least one of the one or more electrical power sources of the power circuit.

12. The system of claim 11, wherein the first monitored value and the second monitored value are based at least in part on the sensor measurements generated by two different sensors that monitor two different electrical power sources of a common type.

13. The system of claim 11, wherein at least one of the first monitored value or the second monitored value is associated with a first power source of the one or more electrical power sources, and the control unit is configured to generate the control signal to electrically isolate the first power source from the other electrical power sources of the power circuit.

14. The system of claim 11, wherein the control unit is configured to change the operating condition by one or more of blocking electrical power transfer between the power circuit and an external powered system, limiting a non-zero electrical power transfer between the power circuit and the external powered system, adjusting an ambient temperature surrounding the power circuit, adjusting a temperature conditioning rate around the power circuit, inducing a designated load on the power circuit, initiating active cooling, or initiating fire suppression.

15. The system of claim 11, wherein the one or more electrical power sources of the power circuit include one or more of an energy supply circuit, a traction motor in a regenerative braking mode, a fuel cell, an alternator, a generator mechanically coupled to the engine, charge transfer contacts for conductive power transfer, or a charge transfer coil for inductive power transfer.

16. The system of claim 11, wherein the control unit is configured to change the operating condition by initiating a first remedial action in response to detecting the deviation condition, the control unit configured to estimate a cause of the deviation condition and modify the first remedial action based on the cause that is estimated.

17. The system of claim 11, wherein the power circuit is a charging system for an electric vehicle, and the control unit is configured to change the operating condition by imposing a movement restriction on the electric vehicle that limits at least one of speed of the electric vehicle, distance traveled of the electric vehicle, an electric load on the power circuit, or a power output of the electric vehicle.

18. A method comprising:
obtaining sensor measurements representative of one or more operating parameters of a power circuit;
determining a reference rate of change value of a first parameter of the one or more operating parameters over time based at least in part on the sensor measurements, wherein the reference rate of change value of the first parameter is generated by an adaptive model generated over time and based on values of the first parameter of the operating parameters over time and values of a second parameter of the operating parameters over time by learning and characterizing a relationship between the first parameter and the second parameter;
comparing rates of change of monitored values of the sensor measurements over time to the reference rate of change value;
determining a deviation condition in response to the rate of change of a first monitored value of the sensor measurements differing from the reference rate of change value by more than a determined tolerance margin value; and
generating a control signal to change an operating condition of the power circuit in response to detecting the deviation condition.

19. The method of claim 18, further comprising:
identifying a first sensor of the sensors that generated sensor measurements on which the first monitored value is based; and
estimating a cause of the deviation condition by comparing the sensor measurements generated by the first sensor prior to changing the operating condition to sensor measurements generated by the first sensor after changing the operating condition.

20. The method of claim 18, wherein generating the control signal to change the operating condition includes initiating a first remedial action in response to detecting the deviation condition, and the method further comprises:
estimating a cause of the deviation condition; and
modifying the first remedial action based on the cause that is estimated.

* * * * *